United States Patent
Horie et al.

(10) Patent No.: US 7,166,415 B2
(45) Date of Patent: Jan. 23, 2007

(54) PHASE-CHANGE RECORDING MATERIAL USED FOR INFORMATION RECORDING MEDIUM AND INFORMATION RECORDING MEDIUM EMPLOYING IT

(75) Inventors: Michikazu Horie, Kanagawa (JP); Takashi Ohno, Kanagawa (JP)

(73) Assignee: Mitsubishi Kagaku Media Co., Ltd., Tokyo (JP)

( * ) Notice: Subject to any disclaimer, the term of this patent is extended or adjusted under 35 U.S.C. 154(b) by 267 days.

(21) Appl. No.: 10/378,990

(22) Filed: Mar. 5, 2003

(65) Prior Publication Data

US 2003/0214857 A1 Nov. 20, 2003

(30) Foreign Application Priority Data

| Mar. 5, 2002 | (JP) | 2002-059005 |
| Jul. 11, 2002 | (JP) | 2002-202744 |
| Nov. 6, 2002 | (JP) | 2002-322708 |

(51) Int. Cl.
*G11B 7/24* (2006.01)

(52) U.S. Cl. .............. 430/270.13; 430/9.15; 428/64.8; 369/275.2; 369/275.5

(58) Field of Classification Search ............... 430/945, 430/270.13; 428/64.8; 369/275.5, 275.2
See application file for complete search history.

(56) References Cited

U.S. PATENT DOCUMENTS

| 3,530,441 A | 9/1970 | Ovshinsky | |
| 4,629,649 A | 12/1986 | Osaka et al. | 430/945 |
| 4,710,452 A | 12/1987 | Raychaudhuri | 430/19 |
| 4,774,170 A | 9/1988 | Pan et al. | |
| 4,795,695 A | 1/1989 | Pan et al. | 430/945 |

(Continued)

FOREIGN PATENT DOCUMENTS

| EP | 0 184 452 | 6/1986 |
| EP | 195532 | * 9/1986 |
| JP | 60-177446 | 9/1985 |
| JP | 61-156545 | 7/1986 |

(Continued)

OTHER PUBLICATIONS

M. Horie., et al., Proceedings of Spie the International Society for Optical Engineering Optical Data Storage, vol. 4090, pp. 135-143, "High Speed Rewritable DVD up to 20m/s With Nucleation-Free Eutectic Phase-Change Material of Ge($Sb_{70}$ $Te_{30}$)+Sb", May 14 and 17, 2000.

(Continued)

*Primary Examiner*—Martin Angebranndt
(74) *Attorney, Agent, or Firm*—Oblon, Spivak, McClelland, Maier & Neustadt, P.C.

(57) ABSTRACT

A phase-change recording material used for an information recording medium utilizing a crystalline state as a non-recorded state and an amorphous state as a recorded state, which has the composition of the following formula (1) as the main component:

$$(Sb_{1-x}Sn_x)_{1-y-w-z}Ge_yTe_wM1_z \qquad \text{formula (1)}$$

wherein each of x, y, z and w represents atomicity, x, z and w are numbers which satisfy $0.01 \leq x \leq 0.5$, $0 \leq z \leq 0.3$ and $0 \leq w \leq 0.1$, respectively, and the element M1 is at least one element selected from the group consisting of In, Ga, Pt, Pd, Ag, rare earth elements, Se, N, O, C, Zn, Si, Al, Bi, Ta, W, Nb and V, and (I) when z=0 and w=0, y is a number which satisfies $0.1 \leq y \leq 0.3$, (II) when $0 < z \leq 0.3$ and w=0, y is a number which satisfies $0.05 \leq y \leq 0.3$, and (III) when $0 \leq z \leq 0.3$ and $0 < w \leq 0.1$, y is a number which satisfies $0.01 \leq y \leq 0.3$.

10 Claims, 7 Drawing Sheets

REFLECTIVE LAYER
DIELECTRIC MATERIAL PROTECTIVE LAYER
RECORDING LAYER
DIELECTRIC MATERIAL PROTECTIVE LAYER
SUBSTRATE

↑
INCIDENCE OF RECORDING AND RETRIEVING LIGHT

U.S. PATENT DOCUMENTS

| | | | |
|---|---|---|---|
| 4,798,785 A | 1/1989 | Pan et al. | 430/945 |
| 4,812,385 A | 3/1989 | Pan et al. | 430/945 |
| 4,812,386 A | 3/1989 | Pan et al. | 430/945 |
| 4,839,207 A | 6/1989 | Yoshitomi et al. | 430/945 |
| 4,865,955 A | 9/1989 | Pan et al. | 430/945 |
| 4,904,577 A | 2/1990 | Tyan et al. | 430/945 |
| 4,960,680 A | 10/1990 | Pan et al. | 430/945 |
| 4,981,772 A | 1/1991 | Pan et al. | 430/945 |
| 5,055,331 A | 10/1991 | Raychaudhuri | 430/945 |
| 5,077,181 A | 12/1991 | Pan et al. | 430/346 |
| 5,234,803 A | 8/1993 | Raychaudhuri | 430/945 |
| 5,271,978 A | 12/1993 | Vazan et al. | 430/945 |
| 5,312,664 A | 5/1994 | Raychaudhuri | 430/945 |
| 5,557,596 A | 9/1996 | Gibson et al. | |
| 5,849,458 A | 12/1998 | Pan et al. | 430/270.13 |
| 5,879,773 A | 3/1999 | Hatwar et al. | 430/270.14 |
| 6,004,646 A | 12/1999 | Ohno et al. | 428/64.1 |
| 6,108,295 A | 8/2000 | Ohno et al. | 369/275.4 |
| 6,115,352 A | 9/2000 | Ohno et al. | 369/275.4 |
| 6,143,468 A | 11/2000 | Ohno et al. | 430/270.13 |
| 6,294,310 B1 | 9/2001 | Ohno et al. | 430/270.13 |
| 6,314,014 B1 | 11/2001 | Lowrey et al. | 365/100 |
| 6,567,367 B1 | 5/2003 | Ohno et al. | 369/116 |
| 6,587,425 B1 | 7/2003 | Ohno et al. | 369/275.2 |
| 6,632,583 B1 | 10/2003 | Kunitomo et al. | 430/270.13 |
| 6,707,783 B1 | 3/2004 | Ohno | 369/275.1 |
| 6,723,410 B1 * | 4/2004 | Ohno et al. | 428/64.1 |
| 2001/0049074 A1 | 12/2001 | Ohno et al. | 430/270.13 |
| 2001/0053115 A1 * | 12/2001 | Nobukuni et al. | 369/59.12 |
| 2002/0001284 A1 | 1/2002 | Inoue et al. | 369/286 |
| 2002/0012305 A1 | 1/2002 | Shingai et al. | 369/59.11 |
| 2002/0015816 A1 | 2/2002 | Shingai et al. | 428/64.4 |
| 2002/0146643 A1 | 10/2002 | Shingai et al. | 430/270.13 |
| 2002/0160305 A1 | 10/2002 | Horie et al. | 430/270.13 |
| 2004/0248036 A1 | 12/2004 | Ohno et al. | |
| 2005/0175822 A1 * | 8/2005 | Ohno et al. | 428/195.1 |
| 2005/0265215 A1 * | 12/2005 | Horie et al. | 369/275.2 |
| 2006/0062125 A1 | 3/2006 | Horie et al. | |

FOREIGN PATENT DOCUMENTS

| | | | |
|---|---|---|---|
| JP | 61-258787 | * | 11/1986 |
| JP | 62-246788 | | 10/1987 |
| JP | 63-076121 | | 4/1988 |
| JP | 63-201927 | | 8/1988 |
| JP | 63-244422 | | 10/1988 |
| JP | 63-298726 | | 12/1988 |
| JP | 64-059651 | | 3/1989 |
| JP | 64-060832 | | 3/1989 |
| JP | 02-088288 | | 3/1990 |
| JP | 04-501742 | | 3/1992 |
| JP | 04-232780 | | 8/1992 |
| JP | 9-286174 | | 11/1997 |
| JP | 9-286175 | | 11/1997 |
| JP | 11-232696 | | 8/1999 |
| JP | 11-240250 | | 9/1999 |
| JP | 2000-79761 | | 3/2000 |
| JP | 2000-233576 | | 8/2000 |
| JP | 2000-313170 | | 11/2000 |
| JP | 2001-39031 | | 2/2001 |
| JP | 2001-67719 | | 3/2001 |
| JP | 2002-008236 | | 1/2002 |
| JP | 2002-011958 | * | 1/2002 |
| JP | 2002-079757 | | 3/2002 |
| JP | 2002-157737 | | 5/2002 |
| JP | 2002-172860 | | 6/2002 |
| JP | 2002-347341 | | 12/2002 |
| JP | 2003-191638 | | 7/2003 |
| JP | 2003-231354 | | 8/2003 |
| JP | 2003-291534 | | 10/2003 |
| JP | 2003-335065 | | 11/2003 |
| WO | 01/97218 | * | 12/2001 |
| WO | WO 02/15175 | | 2/2002 |

OTHER PUBLICATIONS

M. Horie, et al., Proceedings of the 13th Symposium on Phase Change Optical International Storage PCOS, pp. 20-25, "Material Characterization of Growth-Dominant Ge(Sb70Te30)+Sb for Phase-Change Optical Recording Media", Dec. 6 and 7, 2001.

I. Freidrich, et al., Journal of Applied Physics, vol. 87, No. 9, pp. 4130-4134, "Structural Transformations of $Ge_2Sb_2Te_5$ Films Studied by Electrical Resistance Measurements", May 1, 2000.

C. N. Afonso, et al., Appl. Phys. Lett., vol. 60, No. 25, pp. 3123-3125, "Ultrafast Reversible Phase Change in GeSb Films for Erasable Optical Storage", Jun. 22, 1992.

K. Nakayama, et al., Proceedings of the 13th Symposium on Phase Change Optical Information Storage, PCOS2001, pp. 61-66, "Phase-Change Switching Memory", Dec. 6-7, 2001.

J. Feinleib, et al., Applied Physics Letters, vol. 18, No. 6, pp. 254-257, "Rapid Reversible Light-Induced Crystallization of Amorphous Semiconductors", Mar. 15, 1971.

U.S. Appl. No. 09/573,319, filed May 18, 2000, Nobukuni et al.
U.S. Appl. No. 09/530,599, filed May 9, 2000, Horie et al.
U.S. Appl. No. 11/113,119, filed Apr. 25, 2005, Ohno et al.

* cited by examiner

INCIDENCE OF RECORDING AND RETRIEVING LIGHT

INCIDENCE OF RECORDING AND RETRIEVING LIGHT

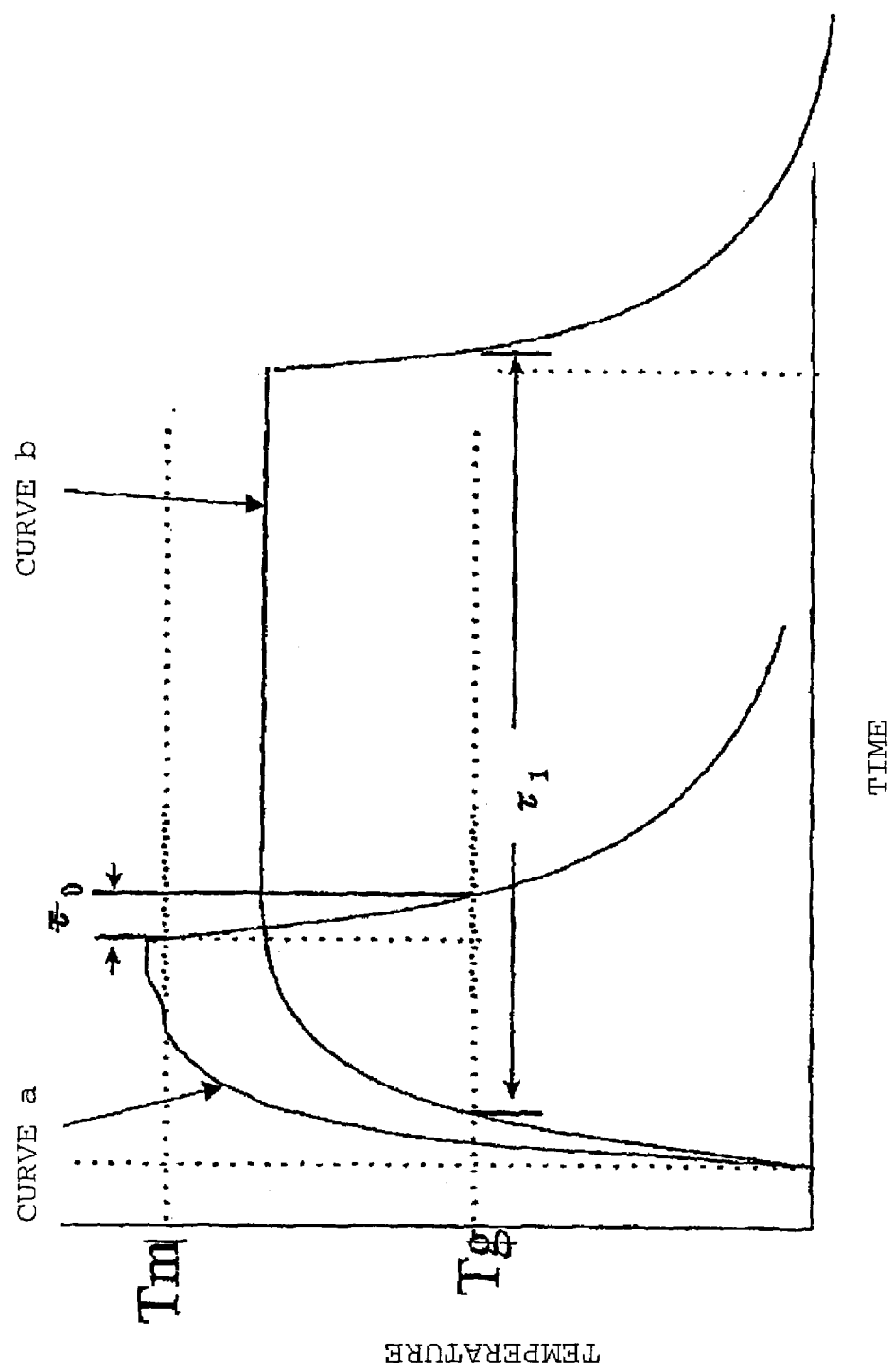

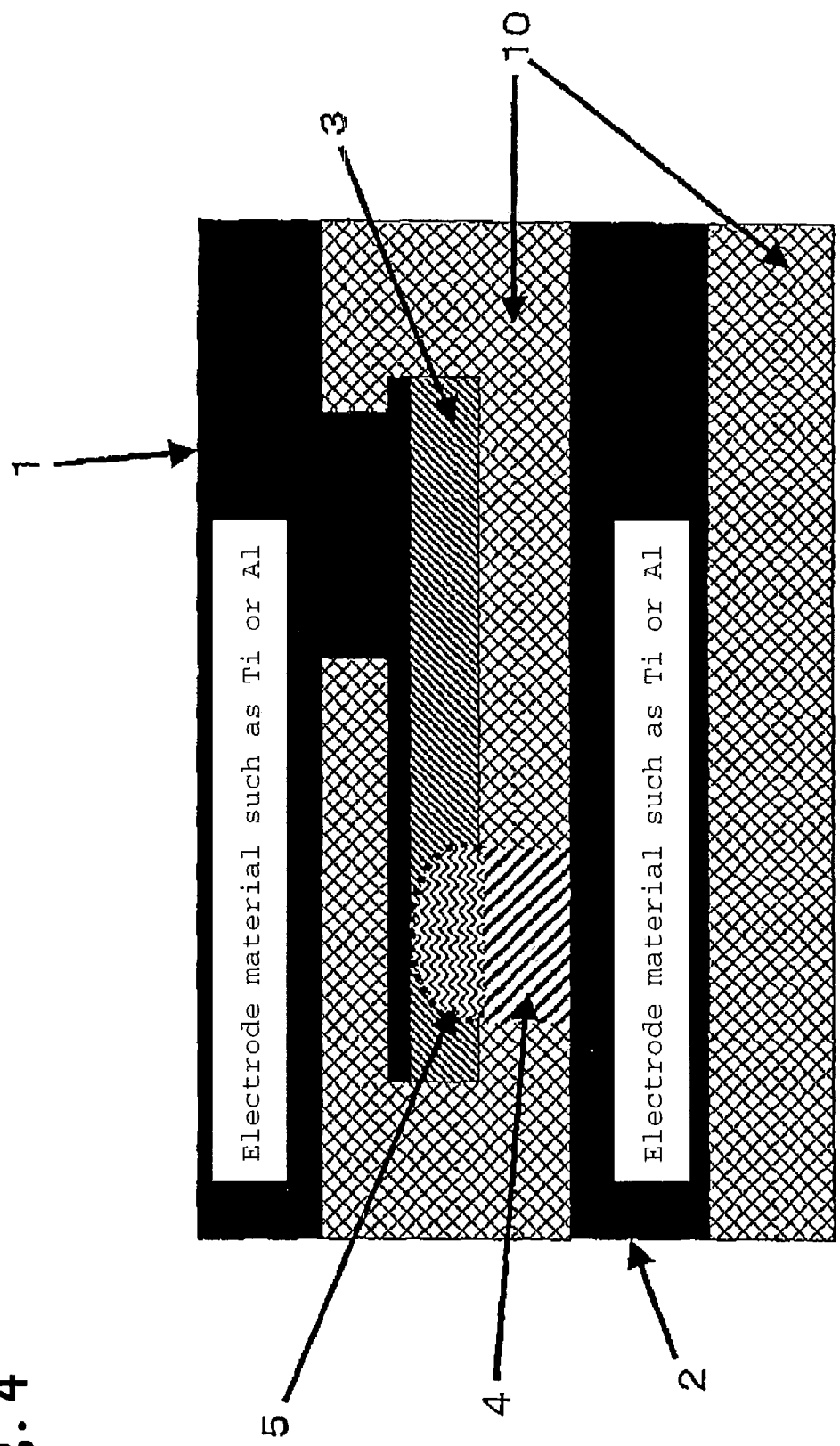

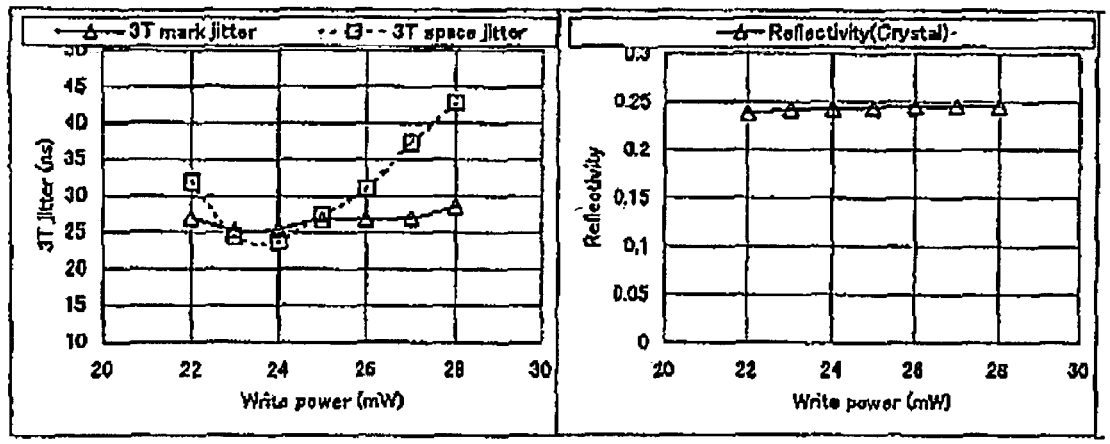
F i g. 6(a)   F i g. 6(b)
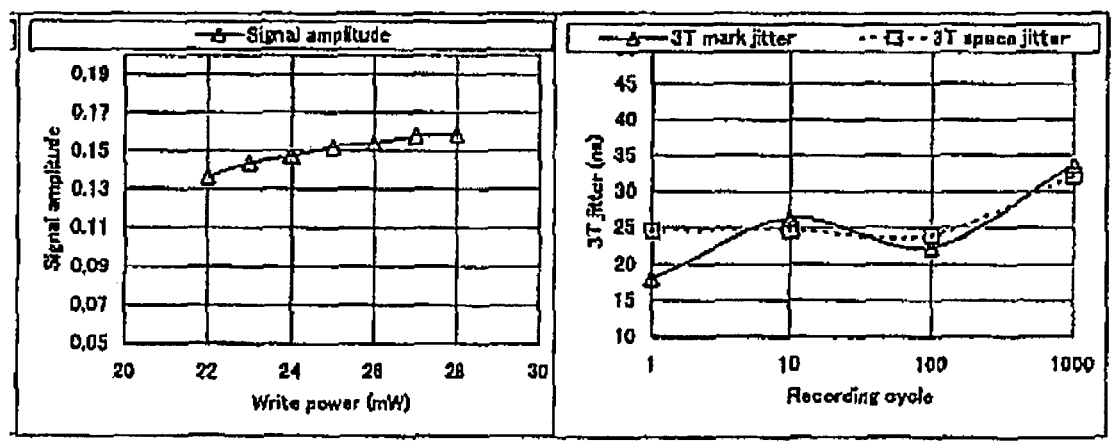
F i g. 6(c)   F i g. 6(d)

PHASE-CHANGE RECORDING MATERIAL USED FOR INFORMATION RECORDING MEDIUM AND INFORMATION RECORDING MEDIUM EMPLOYING IT

The present invention relates to a phase-change recording material utilizing a crystalline state as a non-recorded state and an amorphous state as a recorded state, and an information recording medium utilizing the phase-change recording material. Particularly, it relates to a phase-change recording material used for an information recording medium on which a high speed recording/erasing is possible, and an information recording medium employing the phase-change recording material. Further, it relates to an information recording medium of which initial crystallization is easily carried out, which has a high signal amplitude, which is excellent in repetitive overwriting properties, which is excellent in storage stability and which has excellent jitter properties at a high transfer rate recording.

As a rewritable information recording medium, a method has been known wherein the crystal structure of a metal or a semiconductor is reversibly changed by affecting energy beams or an energy flow such as light or electric current (Joule heating) (J. Feinleib et al. "RAPID REVERSIBLE LIGHT-INDUCED CRYSTALLIZATION OF AMORPHOUS SEMICONDUCTORS", Appl. Phys. lett., Vol. 18 (1971), pp. 254–257, U.S. Pat. No. 3,530,441).

Used practically at present as a means for recording on an information recording medium employing a rewritable phase-change recording material, is to utilize a reversible change between the crystalline phase and the amorphous phase to let the crystalline state in a non-recorded/erased state and to form amorphous marks at the time of recording. Usually, the recording layer is locally heated to a temperature higher than the melting point and then rapidly cooled to form amorphous marks, and the recording layer is heated at a temperature of approximately at most melting point and at least crystallization temperature, and slowly cooled so that the recording layer is kept at a temperature of at most the crystallization temperature for a certain retention time to carry out recrystallization. Namely, in general, a reversible change between the stable crystalline phase and the amorphous phase is utilized. The information is retrieved by detecting the difference in physical parameters such as refractive index, electric resistance, volume and change in density, between the crystalline state and the amorphous state.

Particularly as the application of the information recording medium as an optical recording medium, recording/retrieving/erasing of the information is carried out by utilizing a change in the reflectivity accompanying the reversible change between the crystalline state and the amorphous state caused locally by irradiation of a focused light beam. Such an optical information recording medium having a phase-change type and rewritable type phase-change type recording layer is being developed and used practically as a low cost large capacity recording medium excellent in portability, weather resistance, impact resistance, etc. For example, rewritable CD such as CD-RW has already been used widely, and rewritable DVD such as DVD-RW, DVD+RW and DVD-RAM is being on sale.

As a material for such a phase change type recording layer, a chalcogenide alloy is used in many cases. As such a chalcogenide alloy, a GeSbTe type, InSbTe type, GeSnTe type or AgInSbTe type alloy may, for example, be mentioned. Particularly, a GeTe—$Sb_2Te_3$ pseudo-binary alloy type material is widely used as a recording layer material for an optical recording medium, and in recent years, its application at a non-volatile memory utilizing a change in the electric resistance has been actively studied.

However, in proportion to increase in the volume of information in recent years, an optical recording medium on which recording/retrieving of information at a higher speed is possible, has been desired. Further, high storage stability of recorded information i.e. that information recorded on an optical recording medium does not deteriorate and is stable even after long-term storage, is also one of important performances required for an information recording medium. Among the above information recording media, with respect to the rewritable information recording medium, in order to merely achieve rewriting at a high speed, in a case of utilizing the phase change between the amorphous state and the crystalline state for example, a material having a high crystallization speed is sufficient. However, with a material with which a high speed crystallization is possible, the tendency for the amorphous state to be crystallized in a short time during storage will be remarkable. Accordingly, in order to obtain a rewritable information recording medium with which recording/retrieving at a high speed is possible, and which has a high storage stability of recorded information, transition from the amorphous state to the crystalline state at a high speed by high-speed crystallization is required at the time of erasing, on the contrary, stabilization of the amorphous state by an extremely slow crystallization is required in a storage state in the vicinity of room temperature. That is, seemingly conflicting properties are required for the phase-change recording material.

Further, signal properties being stable after rewriting of information is carried out many times, i.e. high repetitive overwriting properties are also one of important performances required for a rewritable information recording medium.

Further, in a case where the rewritable information recording medium is used as an optical recording medium on which recording/retrieving of information is carried out optically, it tends to be difficult to carry out initial crystallization of the recording layer after production in a short time. However, in view of increasing the production efficiency, carrying out the initial crystallization in a short time is also one of important performances required for an optical recording medium and therefore for a rewritable information recording medium.

Under these circumstances, the present invention has been made to meet such demands, and it is an object of the present invention to provide a phase-change recording material capable of being used for an information recording medium on which recording/erasing at a higher speed is possible, which has a high storage stability of the recording signals, which is excellent in overwriting properties and which has a high productivity, and an information recording medium employing the above material. Further, it is an object of the present invention to provide an optical recording medium which is one form of the application of the information recording medium.

Namely, the present invention provides a phase-change recording material used for an information recording medium utilizing a crystalline state as a non-recorded state and an amorphous state as a recorded state, which has the composition of the following formula (1) as the main component:

formula (1)

wherein each of x, y, z and w represents atomicity, x, z and w are numbers which satisfy 0.01≦x≦0.5, 0≦z≦0.3 and 0≦w≦0.1, respectively, and the element M1 is at least one element selected from the group consisting of In, Ga, Pt, Pd, Ag, rare earth elements, Se, N, O, C, Zn, Si, Al, Bi, Ta, W, Nb and V, and (I) when z=0 and w=0, y is a number which satisfies 0.1≦y≦0.3, (II) when 0<z≦0.3 and w=0, y is a number which satisfies 0.05≦y≦0.3, and (III) when 0≦z≦0.3 and 0<w≦0.1, y is a number which satisfies 0.01≦y≦0.3.

The present invention further provides an information recording medium utilizing a crystalline state as a non-recorded state and an amorphous state as a recorded state, which employs a phase-change recording material having the composition of the following formula (1) as the main component:

$(Sb_{1-x}Sn_x)_{1-y-w-z}Ge_yTe_wM1_z$    formula (1)

wherein each of x, y, z and w represents atomicity, x, z and w are numbers which satisfy 0.01≦x≦0.5, 0≦z≦0.3 and 0≦w≦0.1, respectively, and the element M1 is at least one element selected from the group consisting of In, Ga, Pt, Pd, Ag, rare earth elements, Se, N, O, C, Zn, Si, Al, Bi, Ta, W, Nb and V, and (I) when z=0 and w=0, y is a number which satisfies 0.1≦y≦0.3, (II) when 0<z≦0.3 and w=0, y is a number which satisfies 0.05≦y≦0.3, and (III) when 0≦z≦0.3 and 0<w≦0.1, y is a number which satisfies 0.01≦y≦0.3.

In the accompanying drawings:

FIGS. 1(a) and 1(b) are schematic views illustrating the layer structure of an optical recording medium.

FIG. 3 is a conceptual diagram illustrating the temperature history at the time of amorphous mark recording and the temperature history at the time of erasing by recrystallization.

FIG. 4 is a sectional view illustrating the structure of one cell of a non-volatile memory.

FIGS. 5(a), 5(b), 5(c) and 5(d) are diagrams illustrating the recording properties of an optical recording medium in Example of the present invention.

FIGS. 6(a), 6(b), 6(c) and 6(d) are diagrams illustrating the recording properties of an optical recording medium in another Example of the present invention.

Figure 7:
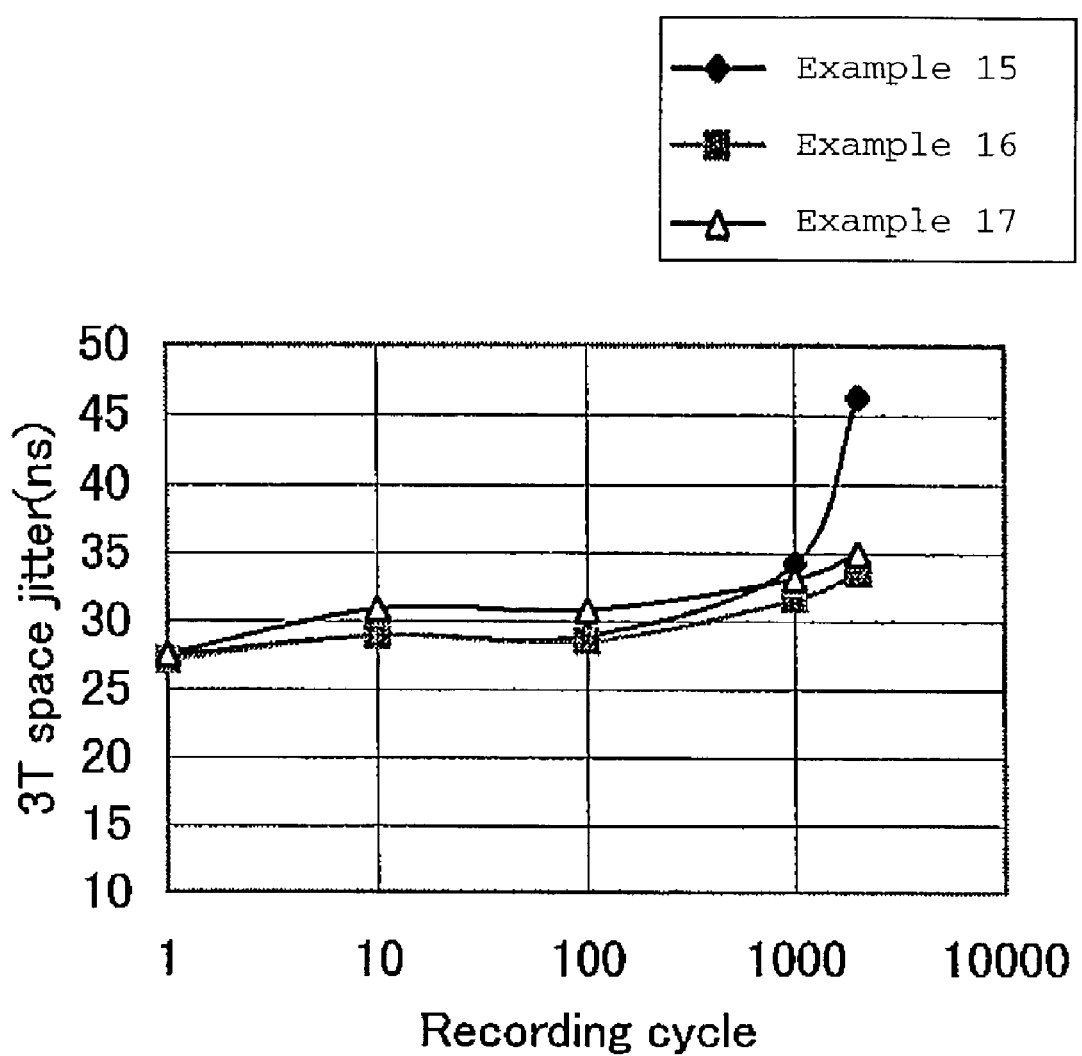

FIG. 7 is a diagram illustrating the recording properties of an optical recording medium in still another Example of the present invention.

Now, the present invention will be described in detail with reference to the preferred embodiments.

By use of a recording layer comprising an alloy shaving the above composition comprising Ge added to a Sb—Sn type alloy, as the main component, an information recording medium having a higher phase-change speed than that of a conventionally known information recording medium can be obtained, and accordingly recording/erasing at a higher speed can be carried out. For example, for an optical recording medium among information recording media, a phase-change recording material having a composition such as GeSbTe has conventionally been employed, however, with a composition which provides an adequately high crystallization speed to such an extent that erasing at a high speed is possible, crystallization may not take place uniformly and the noise tends to be significant, such being problematic. On the other hand, with the phase-change recording material of SbSnGe type used in the present invention, the crystallization speed is high and uniform crystallization becomes possible, and accordingly it can be preferably used for high-speed recording. Further, with a conventional optical recording medium, it tends to be difficult to achieve both high crystallization speed and storage stability of recorded signals, however, with the information recording medium employing the phase-change recording material of the present invention, it becomes possible to achieve both the above performances.

1. Phase-Change Recording Material

The phase-change recording material used in the present invention is a phase-change recording material used for an information recording medium utilizing a crystalline state as a non-recorded state and an amorphous state as a recorded state, and has the composition of the following formula (1) as the main component:

$(Sb_{1-x}Sn_x)_{1-y-w-z}Ge_yTe_wM1_z$    formula (1)

wherein each of x, y, z and w represents atomicity, x, z and w are numbers which satisfy 0.01≦x≦0.5, 0≦z≦0.3 and 0≦w≦0.1, and the element M1 is at least one element selected from the group consisting of In, Ga, Pt, Pd, Ag, rare earth elements, Se, N, O, C, Zn, Si, Al, Bi, Ta, W, Nb and V, and when (I) z=0 and w=0, y is a number which satisfies 0.1≦y≦0.3, when (II) 0<z≦0.3 and w=0, y is a number which satisfies 0.05≦y≦0.3, and when (III) 0≦z≦0.3 and 0<w≦0.1, y is a number which satisfies 0.01≦y≦0.3.

In the present specification, "having a predetermined composition as the main component" means that the content of the predetermined composition is at least 50 atomic % in the entire material or in the entire layer containing the predetermined composition.

Further, when the information recording medium used in the present invention is an optical recording medium, "utilizing a crystalline state as a non-recorded state and an amorphous state as a recorded state" means that an amorphous mark is formed in the crystalline phase.

In the present invention, Ge is incorporated into the Sb—Sn type alloy. Ge has a role to control the crystallization speed of the phase-change recording material, and accordingly by controlling the content of Ge in a predetermined range (10 atomic % to 30 atomic %), a phase-change recording material having a crystallization speed suitable for high speed recording can be obtained.

Further, in the present invention, by incorporating Te into the Sb—Sn—Ge alloy as the case requires, a phase-change recording material more excellent in recording properties can be obtained. Specifically, by incorporating Ge, favorable recording properties can be obtained even in a case where repetitive recording is carried out on a phase-change material after long-term storage. Te also has a role to control the crystallization speed in the same manner as Ge, and accordingly when Ge and Te are incorporated into the Sb—Sn type alloy, the range of Ge content can be extended. Specifically, the lower limit of the Ge content can be decreased to 1 atomic %. Further, by decreasing the Ge content, recording properties after long-term storage of the phase-change recording material can be improved.

In the present invention, by incorporating a predetermined element such as In into the Sb—Sn—Ge alloy or Sb—Sn—Ge—Te alloy, further effects such that the signal amplitude is increased, can be obtained. Further, by using the predetermined element such as In, it may be possible to further control the crystallization speed together with Ge and Te in some cases.

Namely, in the present invention, by incorporating Ge into the Sb—Sn type alloy, a phase-change recording material excellent in high speed recording and storage stability of recording signals can be obtained, by favorably controlling the crystallization speed. Further, by incorporating another element such as Te and/or In into the Sb—Sn—Ge alloy, further effects such that favorable recording properties can be obtained even in the case where a repetitive recording is carried out on the phase-change recording material after long-term storage, and that the signal amplitude can be increased, can be obtained. Further, depending upon the element to be incorporated into the Sb—Sn—Ge alloy, the crystallization speed may be controlled more precisely, and further, recording performance such as recording properties after long-term storage will be favorable. Thus, according to the present invention, a phase-change recording material having desired performances required for the application of use can be obtained.

Further, in the present invention, by employing the phase-change recording material having the composition of the above formula (1) as the main component, for an information recording medium utilizing a crystalline estate as a non-recorded state and an amorphous state as a recorded state, quality of recording signals remarkably improves. Particularly by the use of the above phase-change recording material for a rewritable information recording medium, high speed recording/erasing, improvement in storage stability of recording signals, improvement in overwriting properties, and improvement in overwriting properties in a case where overwriting is further carried out on the rewritable information recording medium after long-term storage, will be achieved. Further, a rewritable information recording medium of which the initial crystallization is easy and which has a high productivity can be obtained. As the rewritable information recording medium, an optical recording medium (such as CD-RW) may, for example, be mentioned, on which recording/retrieving/erasing of information is carried out by utilizing a change in the reflectivity due to a reversible change between the crystalline state and the amorphous state by irradiation of a focused light beam.

Now, the phase-change recording material will be explained with reference to the items (A) when $z=0$ and $w=0$, (B) when $0 \leq z \leq 0.3$ and $w=0$, (C) when $0 \leq z \leq 0.3$ and $0 < w \leq 0.1$ in the above formula (1), and (D) other items.

(A) When $z=0$ and $w=0$

When $z=0$ and $w=0$ in the above formula (1), the phase-change recording material of the present invention is a SbSnGe ternary composition, and the above formula (1) has the following formula (1a):

$(Sb_{1-x}Sn_x)_{1-y}Ge_y$ (1a)

wherein x and y are numbers which satisfy $0.01 \leq x \leq 0.5$ and $0.1 \leq y \leq 0.3$, respectively.

In the formula (1a), when x is at least 0.01, the crystalline state tends to be uniform, and the noise at the time of retrieving can be decreased, such being advantageous. Here, the uniform crystalline state means a polycrystalline structure substantially comprising single crystalline phase and comprising fine crystallites. Fine crystallites mean that the average crystalline grain size is the same or lower order as the size of the recording marks, and the dispersion of the grain size is small.

In the formula (1a), x is preferably $0.05 \leq x$, more preferably $0.1 \leq x$, furthermore preferably $0.15 \leq x$, and particularly preferably $0.2 \leq x$. When x is within this range, more uniform crystalline state can be obtained, and the noise at the time of retrieving can be further decreased.

On the contrary, in the above formula (1a), when x is smaller than 0.01 (Sn is smaller than 1 atomic %), no uniform crystalline state in the entire phase-change recording material can be obtained. This means that a uniform initial crystalline state (non-recorded state) as a presupposition to form high quality amorphous recording marks, can not be obtained. That is, that no uniform crystalline state in the entire phase-change recording material can be obtained, means the it tends to be difficult to let the crystalline state in a non-recorded state and the amorphous state in a recorded state.

Further, when x is large, the difference in optical properties between the crystalline state and the amorphous state tends to be significant, and accordingly a high signal amplitude can be obtained when the information recording medium of the present invention is used as an optical recording medium. However, when x is larger than 0.5, it tends to be difficult to stably carry out formation of amorphous marks (recording) and crystallization of the amorphous marks (erased/non-recorded state), and accordingly x is at most 0.5. Further, in a case where a reversible phase change between the crystalline state and the amorphous state is repeatedly carried out, in order to carry out the reversible phase change (rewriting of information) at least 100 times more securely, preferably $x \leq 0.4$, particularly preferably $x \leq 0.35$. It is considered that the value of x is more preferably within the above range because when Sn is excessively incorporated, no phase change of the phase-change recording material by the change of crystallization/amorphous mechanism considered to be due to phase separation of Sn will not take place.

Particularly, when x is small within a range of x of at least 0.2 and at most 0.35, although the signal amplitude tends to be low, the durability of the phase-change recording material tends to improve when repetitive recording is carried out, such being preferred.

Accordingly, of the phase-change recording material used in the present invention, by controlling the value of x, the above properties can flexibly be realized, and accordingly an appropriate composition depending upon the purpose of use of an information recording medium for which the phase-change recording material is used can be used.

On the other hand, by changing the Ge content in the above formula (1a), the crystallization speed can be controlled. Namely, when y is small in the recording layer composition $(Sb_{1-x}Sn_x)_{1-y}Ge_y$, the crystallization speed tends to be high. With respect to the rewritable information recording medium, taking recording/erasing in a short time into consideration, the crystallization speed is preferably high. Accordingly, in order to obtain an appropriate crystallization speed depending upon the recording conditions of the rewritable information recording medium, the Ge content to be incorporated should be optionally controlled. Specifically, taking e.g. a case of using the rewritable information recording medium as an optical recording medium into consideration, the range of y is at least 0.1, preferably at least 0.12, more preferably at least 0.15, and on the other hand, at most 0.3, preferably at most 0.25, more preferably at most 0.2, as the scanning linear velocity adjustment mechanism of the focused light beam, the laser power rise time, etc. are restricted.

As described above, when the Ge content is low (y is decreased), the crystallization speed increases. For the phase-change recording material of the present invention, a crystallization speed to a certain extent is required. However, if the crystallization speed is too high, the phase-change recording material once melted in the process of amorphous state formation may be recrystallized, at the time of its re-solidification, and no amorphous state tends to be obtained. Further, storage stability of the obtained amorphous state tends to decrease. Accordingly, in order to let the crystalline state in a non-recorded state and the amorphous state in a recorded state, it is necessary that y is at least 0.1 (Ge is incorporated in an amount of at least 10 atomic %).

Further, in the phase-change recording material used in the present invention, Ge is considered to be relevant to the stability of the amorphous marks. Namely, it is considered that when the Ge content is increased, stability of the amorphous marks tends to improve. However, if y is larger than 0.3, the amorphous marks tend to be too stable, and recrystallization (erasing) in a short time and initial crystallization tend to be difficult. In the above formula (1a), when the Ge content is within a range of from at least 10 atomic % and at most 30 atomic %, the amorphous marks will be extremely stable while securing the required crystallization speed, and not only the crystalline state and the amorphous state can be utilized as a non-recorded state and a recorded state, respectively, but also storage stability of the recorded signals will be excellent.

Of the phase-change recording material used in the present invention, the crystallization speed preferably changes significantly depending upon the temperature at the time of crystallization. Namely, it is preferred that the crystallization speed is high when the temperature at the time of crystallization is in a high temperature region in which the temperature is adequately higher than the crystallization temperature and is close to the melting point, and on the other hand, the crystallization speed is low in a low temperature region in the vicinity of room temperature. In the present invention, by using Ge, the above temperature dependency of the crystallization speed can be realized.

(B) When $0<z\leq 0.3$ and $w=0$

When $0<z\leq 0.3$ and $w=0$ in the above formula (1), the phase-change recording material of the present invention has a SbSnGeM1 quaternary composition, and the above formula (1) has the following formula (1b):

$$(Sb_{1-x}Sn_x)_{1-y-z}Ge_yM1_z \quad (1b)$$

wherein x and y are numbers which satisfy $0.01\leq x\leq 0.5$ and $0.05\leq y\leq 0.3$, respectively. In the above formula (1b), the element M1 is at least one member selected from the group consisting of In, Ga, Pt, Pd, Ag, rare earth elements, Se, N, O, C, Zn, Si, Al, Bi, Ta, W, Nb and V.

In order to improve the overwriting properties when overwriting is carried out on the amorphous recording marks after long-term storage, the Sn content is preferably low, however, if the amount of Sn is small, no uniform crystalline state tends to be obtained, the noise tends to be significant, and the initial properties tend to somewhat deteriorate in some cases. In such a case, by incorporating the element M1, the increase of the noise can be suppressed. That is, by using the element M1, the disc excellent in initial properties and having favorable overwriting properties when overwriting is carried out on the recording marks after long-term storage can be obtained.

The reason why the value of x is within a range of $0.01\leq x\leq 0.5$ in the above formula (1b), is as explained in the above item (A). Further, in the above formula (1b), when x is large, the difference in optical properties between the crystalline state and the amorphous state tends to be significant, and accordingly a high signal amplitude can be obtained when the information recording medium of the present invention is used particularly as an optical recording medium. However, in view of further improvement of the repetitive overwriting durability and the signal properties in the case where overwriting is further carried out on the amorphous recording marks after long-term storage, x is preferably at most 0.2. In the SbSnGe ternary composition as in the above formula (1a), in a case where $x\leq 0.2$, the noise of the medium tends to be significant when x is small, however, by addition of the element M1, the noise can be decreased. Accordingly, a phase-change recording material which is more excellent in signal properties when overwriting is further carried out on the recording marks after long-term storage can be obtained.

In the above formula (1b), as the element M1 is required to be incorporated, the value of z is higher than 0, but is preferably at least 0.005, more preferably at least 0.01. Within this range, the crystalline state will be more uniform in the entire phase-change recording material, and the noise will be reduced. Further, when z is within the above range, even when $x\leq 0.2$ in the above formula (1b), the noise can securely be reduced. On the other hand, the value of z is at most 0.3, preferably at most 0.25, more preferably at most 0.2. Within this range, the change in the reflectivity at the time of phase change between the crystalline state and the amorphous state will be adequately large, and further, the phase change speed can be increased.

In the above formula (1b), the element M1 is at least an member selected from the group consisting of In, Ga, Pt, Pd, Ag, rare earth elements, Se, N, O, C, Zn, Si, Al, Bi, Ta, W, Nb and V. By using a small amount of such an element M1, recording properties after a lapse of long time can be improved, or other effects may further be obtained, substantially without changing the crystallization speed. Now, the effects of the element M1 will be explained with regard to (B-1) element selected from In, Ga, Pd, Pt and Ag, (B-2) rare earth elements and (B-3) element selected from Se, N, O, C, Zn, Si, Al, Bi, Ta, W, Nb and V.

By use of the element M1, control of the crystallization speed may be possible in some cases. Accordingly, by using the element M1, the lower limit of the Ge content can be decreased (the amount of Ge can be smaller than 10 atomic %) in the SbSnGeM1 quaternary composition of the above formula (1b). This will be explained in the following item (B-4). However, the adjustment of the crystallization speed by use of the element M1 is the secondary effect, and the adjustment of the crystallization speed of the phase-change recording material is carried out by control of the Ge content first.

(B-1) Element selected from In, Ga, Pd, Pt and Ag

When the element M1 is an element selected from In, Ga, Pd, Pt and Ag in the above formula (1b), although the initial crystallization tends to be somewhat difficult, an effect of increasing the stability of the amorphous marks may be obtained by increasing the crystallization temperature. Further, when the phase-change recording material of the present invention is used for a recording layer of an optical recording medium, the signal amplitude can be increased, such being advantageous. Here, the increase of the signal amplitude means an increase of the change in the refractive index between the crystalline state and the amorphous state.

When the Sn content in the phase-change recording material is decreased, the signal amplitude tends to be low in some cases, and in such a case also, by use of the above element as the element M1, the decrease of the signal amplitude can be compensated. When the Sn content is decreased, repetitive overwriting properties, etc. may be improved, and accordingly when at least one element selected from In, Ga, Pd, Pt and Ag is used as the element M1, x is preferably at most 0.2, particularly preferably at most 0.15 in the above formula (1b).

Particularly when the element M1 to be added is In or Ga, the overwriting properties when overwriting is carried out on the recording marks after long-term storage may be improved. When In is compared with Ga, In provides a higher effect of decreasing the noise. When the element M1 to be added is Pt or Pd, although the improvement of the signal amplitude tends to be small, initial crystallization can be carried out easily, such being advantageous.

Among these elements, it is most preferred to use In when the phase-change recording material of the present invention is used for the optical recording medium. When In is used, it is preferred to control the In and Sn contents. Specifically, x+z in the above formula (1b) is preferably at least 0.05, particularly preferably at least 0.1. Further, the above x+z is preferably at most 0.3, particularly preferably at most 0.25.

(B-2) Rare Earth Elements

The element M1 may be a rare earth element in the above formula (1b). The rare earth elements are Group 3B element of the Periodic Table, and specifically, they include Sc, Y, lanthanoids and actinoids. Such Group 3B elements of the Periodic Table have similar properties, and accordingly any of the above elements may be used as the element M1. Preferred is a series in which the 4f orbital is sequentially filled in view of the electron configuration, and it is preferred to use one or more lanthanoids (15 elements of La, Ce, Pr, Nd, Pm, Sm, Eu, Gd, Tb, Dy, Ho, Er, Tm, Yb and Lu) which tend to have similar properties. Among the above lanthanoid, particularly preferred are Tb and Gd. By use of Tb or Gd, the initial crystallization of the information recording medium will be carried out easily.

Further, when a lanthanoid is used as the element M1, the following effect is also obtained of the phase-change recording material of SbSnGe type of the present invention, the crystallization speed tends to gradually decrease and the recording properties tend to deteriorate in some cases if repetitive overwriting recording is carried out, depending upon e.g. the recording conditions. For example, when the above phase-change recording material is used for a recording layer of a rewritable optical recording medium as one of information recording media, when the number of repetitive recording exceeds 1,000 times, the jitter properties tend to deteriorate in some cases. This tends to be remarkable when x is high within a range of Sn of $0.2 \leq x \leq 0.35$. However, when x is increased (when the amount of Sn is increased), the signal amplitude tends to be high, and recording with a low power may be possible, such being advantageous. Accordingly, if the deterioration of the jitter properties due to repetitive recording can be reduced, it is effective to increase the value of x as far as possible (to increase the amount of Sn as far as possible) so as to increase the signal amplitude. Addition of a lanthanoid provides an effect of suppressing deterioration of the jitter properties accompanying the decrease of the crystallization speed when the above repetitive recording is carried out. Namely, by incorporating a lanthanoid into the SbSnGe type phase-change recording material of the present invention, an information recording medium which has a high signal amplitude, on which recording is possible with a low power, and which is very excellent in repetitive recording durability will be obtained.

The effect by incorporating a lanthanoid is remarkable particularly when the phase-change recording material of the present invention is used for an optical recording medium.

(B-3) Element selected from Se, N, O, C, Zn, Si, Al, Bi, Ta, W, Nb and V

When the element M1 is an element selected from Se, C, Si and Al in the above formula (1b), although the initial crystallization tends to be somewhat difficult, the signal amplitude can be increased, such being advantageous, and an effect of increasing the stability of the amorphous marks may also be obtained by increasing the crystallization temperature.

Further, when the element M1 is an element selected from Bi, Ta, W, Nb and V, although improvement of the signal amplitude is small, the initial crystallization can easily be carried out, such being advantageous.

Further, when the element M1 is an element selected from N, O and Zn, fine adjustment between the optical properties and the crystallization speed can be carried out.

When the element M1 is at least one member selected from the group consisting of Se, N, O, C, Zn, Si, Al, Bi, Ta, W, Nb and V, the upper limit of the content of the element M1 is most preferably 10 atomic %. Namely, z in the above formula (1b) is preferably $z \leq 0.1$, more preferably $z \leq 0.05$. This is because if the above element is incorporated in an amount larger than 10 atomic %, the noise tends to be significant, or the initial crystallization tends to be difficult in some cases.

(B-4) Secondary Effect by Use of the Element M1

By using the element M1 in the above formula (1b), y representing the amount of Ge can be decreased to be smaller than 0.1. As explained in the above item (A), in the ternary composition of SbSnGe, the Ge content can not be lower than 10 atomic % (y cannot be smaller than 0.1) in order that the crystallization speed is not too high, and in order to maintain formation stability and storage stability of the amorphous state recording marks. However, by addition of the element M1, the crystallization speed can be decreased so as to achieve favorable formation of the amorphous state and improvement of the storage stability in some cases. The effect is remarkable particularly when In, Ga, Ag or a lanthanoid (particularly Tb or Gd) is used. Accordingly, the lower limit of the Ge content can be decreased as compared with a case of the SbSnGe ternary composition. Decrease of the Ge content also provides the following effect.

When Ge is incorporated in a large amount, the crystallization speed of the phase-change recording material tends to be low, and the storage stability of the amorphous phase tends to improve. Namely, by using Ge, recrystallization of the amorphous state in a storage state in the vicinity of room temperature can mainly be suppressed, thus improving the storage stability of the amorphous state. Accordingly, by using Ge, the recording stability of the phase-change recording material improves.

However, such an improvement of the archival stability of the amorphous phase may cause such a problem in some cases that the phase change can not favorably be carried out when the amorphous phase after a lapse of long time is crystallized again (erasing of the recording marks). The reason why the above recrystallization of the amorphous phase can not favorably be carried out is not necessarily understood clearly, however, it is considered that the amorphous state once formed by rapid cooling transit to another more stable amorphous state with a lapse of time, and accordingly crystallization after long-term storage can not favorably be carried out. As the amorphous state once formed by rapid cooling is in a locally stable state, it is very likely that the state of atomic bond slightly changes in a long time, and the amorphous state transits to a state which is more stable in view of energy.

Further, from such a viewpoint that emphasis is put on the recording properties when the amorphous marks are recrystallized (erased) after a lapse of long time and then the overwriting of amorphous marks is carried out again, it is preferred to achieve the effect of improving the erasing properties after a lapse of long time, even by making the storage stability of the amorphous phase in the vicinity of room temperature be somewhat unstable, by decreasing the Ge content as far as possible.

However, as described above, in the SbSnGe type ternary composition, if the Ge content is lower than 10 atomic %, the crystallization speed tends to be too high, whereby it tends to be difficult to let the crystalline state in a non-recorded state and the amorphous state in a recorded state. Further, even though the amorphous state is formed, the amorphous state tends to be recrystallized in storage at room temperature, and accordingly it is difficult to make the Ge content less than 10 atomic % in the SbSnGe type ternary composition. Accordingly, in the present invention, the effect of decreasing the crystallization speed or the effect of improving the storage stability of the amorphous state by the element M1, and the effect of increasing the crystallization speed or the effect of decreasing the storage stability of the amorphous state by decreasing the Ge content, are counterbalanced with each other, and accordingly the recording properties after a lapse of long time will be improved substantially without changing the crystallization speed.

However, the effect of decreasing the crystallization speed by the element M1 is not so high as the effect of decreasing the crystallization speed by Te, as mentioned hereinafter. Accordingly, when the element M1 is incorporated into the SbSnGe type ternary composition, the crystallization speed of the phase-change recording material tends to be too high, if the lower limit of the Ge content is lower than 5 atomic % ($y=0.05$). Accordingly, as described hereinafter, although the lower limit of the Ge content can be decreased to 1 atomic % ($y=0.01$) in a case where Te is incorporated into the SbSnGe type ternary composition, the lower limit of the Ge content can be decreased only to 5 atomic % ($y=0.05$) in a case where the element M1 alone is incorporated into the SbSnGe type ternary composition.

Namely, in the above formula (1b), the value of y is at least 0.05, preferably at least 0.08, more preferably at least 0.1, furthermore preferably at least 0.12, particularly preferably at least 0.15. Within this range, favorable recording properties will be obtained even after a lapse of long time. On the other hand, the value of y is at most 0.3, preferably at most 0.25, more preferably at most 0.2. Within this range, crystallization speed required at the time of high transfer rate recording/erasing can be obtained.

(C) When $0 \leq z \leq 0.3$ and $0 < w \leq 0.1$

In the above formula (1), when $0 \leq z \leq 0.3$ and $0 < w \leq 0.1$, the phase-change recording material of the present invention has a composition containing Te. The formula (1) has the following formula (1c):

$$(Sb_{1-x}Sn_x)_{1-y-w-z}Ge_yTe_wM1_z \qquad (1c)$$

wherein x and y are numbers which satisfy $0.01 \leq x \leq 0.5$ and $0.01 \leq y \leq 0.3$, respectively. Further, in the above formula (1c), the element M1 is at least one member selected from the group consisting of In, Ga, Pt, Pd, Ag, rare earth elements, Se, N, O, C, Zn, Si, Al, Bi, Ta, W, Nb and V.

The reason why the value of x is within a range of $0.01 \leq x \leq 0.5$ in the above formula (1c) is as explained in the above item (A) In the SbSnGe ternary composition as in the above formula (1a), when x is increased (such as $x \leq 0.2$), the difference in optical properties between the crystalline state and the amorphous state tends to be significant, and accordingly a high signal amplitude can be obtained particularly when the information recording medium of the present invention is used as an optical recording medium. However, from a viewpoint to further improve repetitive overwriting durability and signal properties in a case where overwriting is further carried out on recording marks after long-term storage, it is preferred to decrease x to a certain extent. If Te is added, even in a case where x is at least 0.2 and is relatively high, the repetitive recording durability and signal properties when overwriting is further carried out on recording marks after long-term storage will improve. Accordingly, a phase-change recording material excellent in all of the initial properties, repetitive recording durability and signal properties in a case where overwriting is further carried out on recording marks after long-term storage, will be obtained.

The Te content is higher than 0 atomic % ($0 < w$), and preferably at least 0.1 atomic % ($0.001 \leq w$), more preferably at least 1 atomic % ($0.01 \leq w$), particularly preferably at least 3 atomic % ($0.03 \leq w$). Within this range, overwriting properties will be favorable when overwriting is carried out on recording marks after long-term storage. On the other hand, if the Te content is high, a crystalline phase of GeTe or a crystalline phase of GeSbTe tends to appear, the uniformity of the crystalline structure in the phase-change recording material of the present invention containing SbSn as the main component tends to decrease, and the reflectivity of the crystalline state and the signal amplitude tend to be low. Accordingly, the Te content is at most 10 atomic % ($w \leq 0.1$), preferably at most 9 atomic % ($w \leq 0.09$), more preferably at most 7 atomic % ($w \leq 0.07$). When the Te content is at most 7 atomic %, the reflectivity of the crystalline state and the signal amplitude can adequately be secured.

Now, the meaning of use of Te in the phase-change recording material of the present invention will be explained in further detail. That is, by using Te, the Ge content in the above formula (1c) can be decreased to be less than 10 atomic % ($y<0.1$), further, less than 5 atomic % ($y<0.05$). As explained in the above item (A), in a SbSnGe ternary composition, from such a viewpoint that the crystallization speed is adjusted to let the crystalline state in a non-recorded state and the amorphous state in a recorded state, y representing the Ge content can not be less than 0.1. Further, as explained in the above item (B), in the case of the a quaternary composition comprising M1 (such as In) having a role to adjust e.g. the crystallization speed added to SbSnGe, the lower limit of the Ge content can be decreased to 5 atomic % ($y=0.05$). However, in such a case also, when the Ge content is lower than 5 atomic %, the crystallization speed of the phase-change recording material tends to be too high.

When Te is incorporated in the phase-change recording material having such a composition, the crystallization speed can further be decreased. As mentioned above, Ge is an element which has a powerful role to decrease the crystallization speed. Accordingly, the lower limit of the Ge content can be decreased as compared with the composition of SbSnGe or SbSnGeM1. Decreasing the Ge content also has the following effects.

When Ge is incorporated in a large amount, the crystallization speed of the phase-change recording material tends to be low, whereby the storage stability of the amorphous state tends to improve. Namely, by use of Ge, recrystallization of the amorphous state stored mainly in the vicinity of room temperature can be suppressed, and the storage stability of the amorphous state will improve. Accordingly, by using Ge, the recording stability of the phase-change recording material will improve.

However, this improvement of the storage stability of the amorphous state may cause such a problem that the phase change can not favorably be carried out when the amorphous state after a lapse of long time after recording, is crystallized again (erasing of recording marks) in some cases. The reason why the amorphous state can not favorably be crystallized again is not necessarily understood clearly, however, it is considered that the amorphous state once formed by rapid cooling transfers to another more stable amorphous state as time goes by.

Accordingly, from such a viewpoint that emphasis is put on recording properties in such a case that the amorphous marks are once recrystallized (erased) after the lapse of long time and then the amorphous marks are recorded again, it is preferred to achieve the effect of improving the erasing properties after a lapse of long time, even by making the storage stability of the amorphous state in the vicinity of room temperature be somewhat unstable, by decreasing the Ge content as far as possible. However, as described above, when the Ge content is low, the crystallization speed tends to be too high, whereby it becomes difficult to let the crystalline state in a non-recorded state and the amorphous state in a recorded state. Further, even if the amorphous state is formed, the amorphous state is likely to be recrystallized in storage at room temperature. Accordingly, in the present invention, by use of Te, the effect of decreasing the crystallization speed or the effect of improving the storage stability of the amorphous state by Te, and the effect of increasing the crystallization speed or the effect of decreasing the storage stability of the amorphous state by decreasing the Ge content, are counterbalanced with each other, and accordingly the recording properties after a lapse of long time will be improved substantially without changing the crystallization speed.

Further, it is estimated that by use of Te, such an effect that transfer of the amorphous state to another more stable amorphous state by the above-described change with time is suppressed, is also obtained.

Taking the above into consideration, y representing the Ge content in the above formula (1c) is at least 0.01, preferably at least 0.05, more preferably at least 0.08, further more preferably at least 0.1. Within this range, favorable recording properties even after a lapse of long time will be obtained. On the other hand, the value of y is at most 0.3, preferably at most 0.25, more preferably at most 0.2. Within this range, crystallization speed required for recording/erasing at a high transfer rate will be obtained.

One purpose of use of Te in combination with Ge for the phase-change recording material is further to increase long-term storage stability as compared with the case of Ge alone as described above. Accordingly, it is preferred that Te is used subsidiary to Ge. Further, the total content of Ge and Te is preferably $y+w \leq 0.3$, more preferably $y+w \leq 0.2$. On the other hand, in order to secure stability of the amorphous marks, $y+w$ is usually at least 0.05, preferably at least 0.07, more preferably at least 0.1.

Further, the meaning of use of the element M1 in the above formula (1c) is as explained in the above item (B) (by use of the element M1, the increase of the noise will be suppressed, another effect may further be obtained depending upon the type of the element M1 used, etc.). Further, the range of z representing the content of the element M1 in the above formula (1c) and the reason why z is within such a range, etc. are also explained in the above item (B).

The reflectivity in the crystalline state and the signal amplitude of the phase-change recording material tend to decrease by addition of Te, and accordingly when an element which has a role to increase the signal amplitude such as In, Pd, Ag or Au is added as the element M1 simultaneously with addition of Te, a more favorable phase-change recording material will be obtained. Most preferred as the element M1 to be used in combination with Te is In. In this case, the formula (1) has the following formula (1d):

$$(Sb_{1-x}Sn_x)_{1-y-w-z}Ge_yTe_wIn_z \qquad (1d)$$

Particularly, in order to suppress the decrease in the optical contrast due to addition of Te, the amount of In or Sn should be large, and the ratio of the total content of In and Sn $\{x \times (1y-w-z)+z\}$ to the Te content w, i.e. $\{x \times (1-y-w-z)+z\}/w$ is at least 2, more preferably at least 3.

(D) Other Items

The phase-change recording material of the present invention preferably contains Sb as the main component. As the element most effective for high-speed crystallization is Sb, favorable recrystallization can be carried out even in a case where recrystallization of amorphous marks (erasing) is carried out by irradiation of an energy beam in a time shorter than 100 nsec, for example, when a phase-change recording material containing Sb as the main component is used. Accordingly, in the above formula (1), the Sb content is preferably at least 50 atomic %. Namely, it is preferred that $(1-x) \times (1-y-w-z) \geq 0.5$. By using Sb as the main component, a single crystalline phase comprising a Sb hexagonal structure as the base will easily be obtained.

Further, in the above formula (1), in order to precisely control the crystallization speed, it is important to control the total content of Ge, Te and the element M1. Accordingly, $y+z+w$ is preferably at least 0.1, more preferably at least 0.15. Within such a range, amorphous marks will favorably be formed. On the other hand, $y+z+w$ is preferably at most 0.4, more preferably at most 0.3. Within such a range, the phase-change speed will be adequately high, and the change in the reflectivity at the time of phase change will be significant. Further, within the above range, appearance of another stable crystalline phase by combination of Ge, Te and the element M1 will be suppressed.

The meaning of controlling the sum of y, z and w in the above formula (1) will be explained in detail below.

In the above formula (1), by changing the Ge content, the crystallization speed can be controlled. Namely, in the recording composition $(Sb_{1-x}Sn_x)_{1-y-w-z}Ge_yTe_wM1_z$, the crystallization speed tends to be high when y is small. It is necessary that the crystallization speed is high for recording/erasing in a short time on a rewritable information recording medium in general. Accordingly, in order to obtain crystallization speed depending upon the recording conditions of a rewritable information recording medium, the Ge content to be incorporated should be optionally controlled. However, the crystallization speed also relates to the values of z and w, and when z or w is high, the crystallization speed tends to be low. Accordingly, in order to control the crystallization speed, it is effective to control y+z+w to be within the above predetermined range by decreasing y when z or w is high.

JP-A-63-201927 discloses recording elements of a write once type, comprising a SbSnGe type alloy. However, the principle of forming the recording marks is different from that of the present invention. Namely, in the write once type medium as disclosed in JP-A-63-201927, an amorphous film obtained at the time of preparation of the medium is utilized as a non-recorded state, and crystalline recording marks are formed therein by light irradiation. On the other hand, in the phase-change recording material of the present invention, the crystalline state of the phase-change recording material is in a non-recorded state, and the amorphous state is in a recorded state. Particularly when the phase-change recording material of the present invention is used for an optical recording medium, it is important that the entire recording layer containing the phase-change recording material is in a uniform crystalline state. In the optical recording medium, amorphous recording marks are formed in the above recording layer in the uniform crystalline state.

Here, the performances required for the phase-change recording material are significantly different between the case where crystalline recording marks are formed on a write once type medium and the case where the amorphous recording marks are formed as in the medium of the present invention.

First, the range of the crystallization speed required for the phase-change recording material is different as between the case where crystalline recording marks are formed on a write once type medium and the case where amorphous recording marks are formed as in the medium of the present invention. Namely, in a case where crystalline recording marks are formed on a write once type medium, it is required to use a phase-change recording material having a very high crystallization speed, because not only once formed crystalline recording marks are not required to be recovered to the amorphous state, but also it is unfavorable that the recording marks recover to the amorphous state from the viewpoint of securing the stability of the crystalline marks. Further, in a phase-change recording material having a low crystallization speed, before the entire area which is melted by e.g. light irradiation becomes in a crystalline state, part of the area becomes in an amorphous state, and thus the recording marks may deform, such being problematic.

On the other hand, in a case where the amorphous recording marks are formed as in the medium of the present invention, if the crystallization speed of the phase-change recording material is too high, the area which is melted by e.g. light irradiation is recrystallized, and the amorphous recording marks can not be formed. Accordingly, in order to stably form the amorphous recording marks, it is required to achieve the crystallization speed with the crystallization speed and the stability of the amorphous recording marks are well balanced. Accordingly, in order to keep a favorable balance of the crystallization speed with the stability of the amorphous recording marks, the temperature dependency of the crystallization speed is preferably high. Namely, in a case where the amorphous recording marks are recrystallized, the temperature at the time of crystallization is in a high temperature region which is adequately higher than the crystallization temperature and is close to the melting point, and the crystallization speed is preferably high in this temperature region. On the other hand, from the viewpoint to increase the storage stability of the amorphous recording marks, in a low temperature region which is adequately lower than the crystallization temperature and is in the vicinity of the room temperature, the crystallization speed is preferably low in order to prevent recrystallization of amorphous marks. In the phase-change recording material of the present invention, by using Ge and further by controlling the Ge content, the above temperature dependency of the crystallization speed can be realized.

Second, the required properties regarding crystalline nucleation in the phase-change recording material are also totally different as between the case of forming crystalline recording marks on a write once type medium and the case where amorphous recording marks are formed as in the medium of the present invention. Namely, in a case where crystalline recording marks are formed in the amorphous state, it is required that a large number of crystalline nuclei are present in the amorphous state. This is because the crystalline recording marks can not be formed in a region where no crystalline nuclei are present, and it is required that a large number of crystalline nuclei are present in the region on which recording marks are to be formed, in order to accurately control the shape and the position of the crystalline recording marks. If the number of the crystalline nuclei is insufficient, as the position of the crystalline recording mark formation depends on the position of the crystalline nuclei, recording properties such as jitters tend to deteriorate.

On the other hand, in a case where amorphous recording marks are formed in a uniform crystalline state as in the medium of the present invention, it is preferred that no crystalline nuclei are present in the phase-change recording material, or even if they are present, the number of the crystalline nuclei is small to such an extent that the crystalline nuclei do not substantially function in the process of forming amorphous recording marks. This is because if the crystalline nuclei effectively function in the process of mark formation, a part of or the entire melted region on which the amorphous marks are to be formed, is recrystallized without being formed into an amorphous state. Namely, in a case where amorphous marks are formed, it is preferred that the shape of the marks is determined only by the heat history of the phase-change recording material without being affected by the number or the position of the crystalline nuclei as far as possible.

Further, in the present invention, even if no crystalline nuclei are present in the recording marks when the amorphous recording marks are erased by recrystallization, crystalline growth takes place with crystals at the periphery of the recording marks as the starting point, and accordingly it is not required that the crystalline nuclei are present in the amorphous state. In the present invention, by using Ge and further by controlling the Ge content, formation of the crystalline nuclei in the phase-change recording material can effectively be suppressed. Formation of the crystalline nuclei proceeds in a temperature region lower than a temperature region in which the crystalline growth takes place in general. Accordingly, suppression of the crystalline nucleation is preferred also in view of storage stability of the amorphous marks in the vicinity of room temperature.

As mentioned above, the properties required for the phase-change recording material (such as the optimum region of the crystallization speed) and the crystalline state of the phase-change recording material (such as whether it is in a crystalline state in which a large number of crystalline nuclei are present, or it is a uniform crystalline state with a small number of crystalline nuclei), are different as between the case where crystalline recording marks are formed in a write once type medium and the case where amorphous recording marks are formed as in the medium of the present invention. As a result, the composition ranges of the phase-change recording material on which crystal recording marks are formed and the phase-change recording material on which amorphous recording marks are formed, are different of course.

JP-A-2002-11958 discloses a write once type optical recording medium comprising InSnSb and a slight amount of Ge incorporated thereinto. However, the optical recording medium is to form recording marks in a crystalline state on a recording layer in an amorphous state (crystal recording type), and accordingly formation of recording marks in an amorphous state and improvement of storage stability of the recording marks in an amorphous state are not considered at all. Further, the recording medium is an optical recording medium of a crystal recording type, the Ge content is less than 5 atomic % in the recording layer composition as specifically disclosed.

2. Information Recording Medium

The information recording medium of the present invention is an information recording medium utilizing the crystalline state as a non-recorded state and the amorphous state as a recorded state, and is characterized by using the phase-change recording material having the composition of the above formula (1) as the main component. As explained in the above item "1. phase-change recording material", when the phase-change recording material having the composition of the above formula (1) as the main component is used for a rewritable information recording medium, the effect of improving the quality of the recording signals and the effect of improving the productivity of the information recording medium tend to be particularly remarkable. Accordingly, in the present invention, the information recording medium is preferably used as a rewritable information recording medium on which the information can be rewritten by a reversible change of the phase-change recording material having the composition of the above formula (1) as the main component between the crystalline state and the amorphous state.

More preferably, the information recording medium of the present invention is an optical recording medium, and is an information recording medium having a phase-change type recording layer containing the phase-change recording material having the composition of the above formula (1) as the main component and at least one protective layer. More preferably, the optical recording medium is a rewritable information recording medium.

Now, the specific constitution of the medium and the recording/retrieving method will be described in detail in the following items (A) to (C), in a case of applying the phase-change recording material to be used in the present invention to a rewritable optical recording medium (hereinafter "rewritable optical recording medium" will be referred to simply as "optical recording medium").

(A) Layer Structure

Figure 1A:
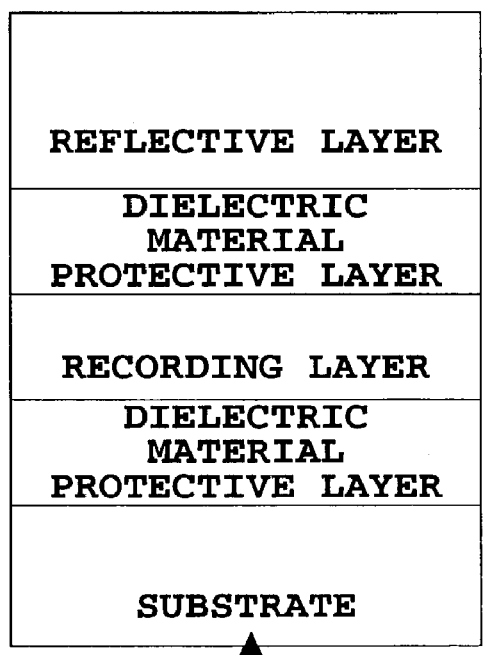
Figure 1B:
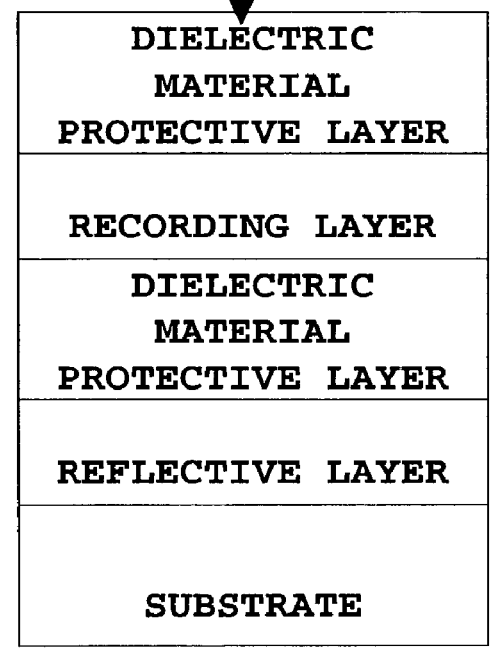

As the optical recording medium, usually one having the multilayer structure as shown in FIG. 1(a) or FIG. 1(b) is employed. Namely, as evident from FIGS. 1(a) and 1(b), it is preferred that the recording layer to be used for the optical recording medium of the present invention and on at least one side thereof, heat resistant protective layers are formed, on a substrate. A reflective layer is formed on the side opposite to the incidence of recording and retrieving light beam in many cases, but the reflective layer is not essential. Further, a translucent absorption film is optionally formed on the side of the incidence of light with a purpose of controlling the light absorption. Further, the protective layer which is preferably formed on at least one side of the recording layer, is made to have a multilayer structure with materials having different properties.

Now, the recording layer will be explained below.

As the material contained in the recording layer, the phase-change recording material of the above formula (1) is used as the main component. In order to effectively obtain the effect of the present invention, the phase-change recording material of the above formula (1) is contained in an amount of usually at least 50 atomic %, preferably at least 80 atomic %, more preferably at least 90 atomic %, particularly preferably at least 95 atomic %, in the entire recording layer. The higher the content, the more remarkable the effect of the present invention. However, the effect of the present invention such as high speed recording/erasing will securely be obtained even if another component such as O or N is incorporated at the time of recording layer formation, if its content is within a range of several atomic % to 20 atomic %.

The thickness of the recording layer is usually at least 1 nm, preferably at least 5 nm, particularly preferably at least 10 nm, whereby the contrast of the reflectivity between the crystalline state and the amorphous state will be sufficient, and the crystallization speed will be sufficient, whereby recording/erasing in a short time will be possible. Further, the reflectivity itself will be sufficient. On the other hand, the thickness of the recording layer is usually at most 30 nm, preferably at most 25 nm, particularly preferably at most 20 nm, whereby a sufficient optical contrast will be obtained, and no cracks are likely to form on the recording layer. Further, no significant deterioration of the recording sensitivity due to increase of the thermal capacity will take place. Further, within the above film thickness range, the volume change due to a phase change can appropriately be suppressed, whereby microscopic and irreversible deformation of the recording layer itself or the protective layer to be formed on or below it, which may cause noise, is less likely to be accumulated when overwriting is repeatedly carried out. Such an accumulation of the deformation tends to decrease the repetitive overwriting durability, and this tendency can be suppressed by making the thickness of the recording layer within the above range.

The requirement against noise is more severe in a case where recording/retrieving is carried out by means of a focused light beam with LD (laser diode) having a wavelength of about 650 nm with an objective lens with a numerical aperture of from about 0.6 to about 0.65, such as a rewritable DVD, or in a case of a high density medium on which recording/retrieving is carried out by means of a focused light beam with a blue LD having a wavelength of about 400 nm with an objective lens with a numerical aperture of from about 0.7 to about 0.85. Accordingly, in such a case, a more preferred thickness of the recording layer is at most 25 nm.

The above recording layer can be obtained by DC or RF sputtering of a predetermined alloy target in an inert gas, particularly in an Ar gas.

Further, the density of the recording layer is usually at least 80%, preferably at least 90% of the bulk density. The bulk density $\rho$ is usually an approximate value by the following formula (2), but it may actually be measured by preparing a mass of the alloy composition constituting the recording layer:

$$\rho = \Sigma m_i \rho_i \qquad (2)$$

wherein $m_i$ is the molar concentration of each element i, and $\rho_i$ is the atomic mass of each element i.

In a film formation method by sputtering, the density of the recording layer can be increased by increasing the high energy Ar amount to be irradiated on the recording layer, by e.g. decreasing the pressure of the sputtering gas (usually an inert gas such as Ar: the following explanation will be made with reference to the case of Ar as an example) at the time of film formation or by disposing a substrate in the vicinity of the front of the target. The high energy Ar is either part of Ar ions to be irradiated on the target for sputtering, being reflected and arriving at the substrate side, or Ar ions in the plasma being accelerated by the sheath voltage on the entire substrate surface arriving at the substrate is general.

Such an irradiation effect of a high energy inert gas is called atomic peening effect, and in sputtering by an Ar gas commonly used, Ar is incorporated in the sputtering film by the atomic peening effect. The atomic peening effect may be estimated from the Ar amount in the film. Namely, the smaller Ar amount means a smaller effect of high energy Ar irradiation, and a less dense film is likely to form.

On the other hand, when the Ar amount is large, irradiation of the high energy Ar tends to be intense, and the density of the film will be high, however, Ar incorporated in the film is likely to deposit as voids at the time of repetitive overwriting, whereby repetitive durability is likely to deteriorate. Accordingly, a charging is carried out under an appropriate pressure, usually in the order of from $10^{-2}$ to $10^{-1}$ Pa.

Now, other components in the structure of the optical recording medium which is an preferred embodiment of the present invention will be explained below.

As the substrate used in the present invention, a resin such as polycarbonate, acryl or polyolefin, glass or a metal such as aluminum may be employed. Guide grooves having a depth of from about 20 to about 80 nm are usually formed on the substrate, and preferred is a substrate made of a resin on which the guide grooves can be formed by molding. Further, in a case of a so-called incidence from the substrate side wherein the focused light beam for recording/erasing/retrieving is incident from the substrate side (FIG. 1(a)), the substrate is preferably transparent.

In order to prevent evaporation/deformation of the recording layer due to the phase change and to control heat diffusion at that time, a protective layer is usually formed on one side or on both sides of the recording layer, preferably on both sides. The material of the protective layer is determined in consideration of refractive index, thermal conductivity, chemical stability, mechanical strength, adhesion properties and so on. Generally, a dielectric material such as an oxide, a sulfide, a carbide or a nitride of a metal or a semiconductor material having a high transparency and a high melting point, or a fluoride of Ca, Mg, Li or the like, may be used.

In such a case, these oxide, sulfide, carbide, nitride and fluoride are not always necessary to have a stoichiometric composition. It is effective to control the composition to adjust the refractive index and so on, or to use a mixture of these materials. A mixture of dielectric materials is preferred taking the repetitive recording properties into consideration. More specifically, a mixture of a heat resistant compound such as an oxide, a nitride, a carbide or a fluoride with ZnS or a chalcogen compound such as a rare earth sulfide may be mentioned. For example, a mixture of heat resistant compounds containing ZnS as the main component, and a mixture of heat resistant compounds containing an oxysulfide of rare earth particularly $Y_2O_2S$ as the main component, are mentioned as examples of preferred protective layer composition.

As the material to form the protective layer, usually a dielectric material may be mentioned. The dielectric material may, for example, be an oxide of e.g. Sc, Y, Ce, La, Ti, Zr, Hf, V, Nb, Ta, Zn, Al, Cr, In, Si, Ge, Sn, Sb or Te, a nitride of e.g. Ti, Zr, Hf, V, Nb, Ta, Cr, Mo, W, Zn, B, Al, Ga, In, Si, Ge, Sn, Sb or Pb, a carbide of e.g. Ti, Zr, Hf, V, Nb, Ta, Cr, Mo, W, Zn, B, Al, Ga, In or Si, or a mixture thereof. Further, as the dielectric material, a sulfide, a selenide or a telluride of e.g. Zn, Y, Cd, Ga, In, Si, Ge, Sn, Pb, Sb or Bi, a fluoride of e.g. Mg or Ca, or a mixture thereof may be mentioned.

Further, as specific examples of the dielectric material, $ZnS$—$SiO_2$, $SiN$, $SiO_2$, $TiO_2$, $CrN$, $TaS_2$ or $Y_2O_2S$ may, for example, be mentioned. Among these materials, $ZnS$—$SiO_2$ is widely used in view of a high film formation speed, a small film stress, a small volume change due to the change in temperature and an excellent weather resistance.

Taking the repetitive recording properties into consideration, the film density of the protective layer is preferably at least 80% of the bulk state, in view of mechanical strength. When a mixture of dielectric materials is used, the theoretical density of the above formula (2) is employed as the bulk density.

The thickness of the protective layer is usually from 1 nm to 500 nm in general. When the thickness is at least 1 nm, the effect of preventing the deformation of the substrate or the recording layer can be adequately obtained, and its role as a protective layer can adequately be performed. Further, when the thickness is at most 500 nm, while the role as the protective layer is adequately performed, e.g. the internal stress of the protective layer itself or the difference in elastic properties with the substrate tend to be remarkable, thus preventing generation of cracks.

Particularly when a protective layer (hereinafter sometimes referred to as a lower protective layer) is formed between the optical-beam entrance substance and the recording layer, the lower protective layer is required to suppress deformation of the substance by heat, and accordingly its thickness is usually at least 1 nm, preferably at least 5 nm, particularly preferably at least 10 nm, whereby accumulation of microscopic deformation of the substance during repetitive overwriting will be suppressed, whereby the increase of noise caused by scattering of the retrieving light will not be remarkable.

On the other hand, the thickness of the lower protective layer is preferably at most 200 nm, more preferably at most 150 nm, furthermore preferably at most 0.100 nm, in relation to the time required for film formation. When the thickness is within this range, the groove shape of the substrate as observed on the recording layer plane will not change. Namely, such a phenomenon is less likely to take place that the depth or width of the grooves are smaller than the shape attempted on the substrate surface.

On the other hand, when a protective layer (hereinafter sometimes referred to as an upper protective layer) is formed on the side of the recording layer opposite to the optical-beam entrance side, the thickness of the upper protective layer is usually at least 1 nm, preferably at least 5 nm, particularly preferably at least 10 nm, in order to suppress deformation of the recording layer. Further, in order to prevent accumulation of microscopic plastic deformation in the inside of the upper protective layer generated due to the repetitive overwriting and to suppress the noise increase due to scattering of retrieving light, it is preferably at most 200 nm, more preferably at most 150 nm, furthermore preferably at most 100 nm, particularly preferably at most 50 nm.

The thickness of each of the recording layer and the protective layer is selected so as to provide good laser light absorbing efficiency and to increase the amplitude of the recording signals, i.e. to increase the contrast between a recorded state and a non-recorded state in consideration of an interfering effect caused by a multilayer structure, in addition to restrictions from mechanical strength and reliability.

On the optical recording medium, a reflective layer may further be formed. The position on which the reflective layer is formed usually depends on the direction of incidence of retrieving light, and it is formed on the side of the recording layer opposite to the incidence side namely, in a case where a retrieving light is incident from the substrate side, the reflective layer is usually formed on the side of the recording layer opposite to the substrate, and in a case where retrieving light is incident from the recording layer side, the reflective layer is formed usually between the recording layer and the substrate (FIGS. 1(a), (b)).

The material used for the reflective layer is preferably a substance having a high reflectivity, and particularly preferred is a metal such as Au, Ag or Al with which heat dissipation effect can be expected. Its heat dissipation property is determined by the film thickness and the thermal conductivity, and as the thermal conductivity is substantially in proportion to the specific volume resistance in the case of these metals, and accordingly the heat dissipation property can be represented by the sheet resistivity. The sheet resistivity is usually at least 0.05 Ω/□, preferably at least 0.1 Ω/□, and usually at most 0.6 Ω/□, preferably at most 0.5 Ω/□.

This is to secure a particularly high heat dissipation property, and it is required to suppress recrystallization to a certain extent in a case where the competition between amorphous state forming and recrystallization is significant in formation of the amorphous marks as in the recording layer to be used for the optical recording medium. A small amount of Ta, Ti, Cr, Mo, Mg, V, Nb, Zr, Si or the like may be added to the above metal to control the thermal conductivity of the reflective layer itself or to improve corrosion resistance. The addition amount is usually at least 0.01 atomic % and at most 20 atomic %. An aluminum alloy containing Ta and/or Ti in an amount of at most 15 atomic %, particularly an alloy of $Al_\alpha Ta_{1-\alpha}$ ($0 \leq \alpha \leq 0.15$) is excellent in corrosion resistance, and is a particularly preferred reflective layer material in view of improving the reliability of the optical recording medium.

Further, a Ag alloy comprising Ag and at least one member selected from Mg, Ti, Au, Cu, Pd, Pt, Zn, Cr, Si, Ge and rare earth elements in an amount of at least 0.01 atomic % and at most 10 atomic % added to Ag, also has high reflectivity and thermal conductivity and excellent heat resistance and is thereby preferred.

Particularly when the thickness of the upper protective layer is at least 5 nm and at most 50 nm, the amount of the element to be added is preferably at most 2 atomic % in order that the reflective layer has a high thermal conductivity.

Particularly preferred as a material of the reflective layer is one containing Ag as the main component. The reason why it is preferred to employ Ag as the main component is as follows. Namely, when overwriting is carried out again on the recording marks after long-term storage, such a phenomenon may take place in some cases that the recrystallization speed of the phase-change recording layer is high only at the time of the first overwriting immediately after the storage. Although the reason of such a phenomenon is not clearly understood, by increase of the recrystallization speed of the recording layer immediately after the storage, the size of the amorphous marks formed by the first overwriting immediately after the storage is smaller than the desired size of the marks. Accordingly, when such a phenomenon takes place, recrystallization of the recording layer at the time of the first overwriting immediately after the storage can be suppressed, whereby a desired size of the amorphous marks can be maintained, by increasing the cooling rate of the recording layer by using Ag having a very high release property for the reflective layer.

The thickness of the reflective layer is preferably at least 10 nm so that the incident light is completely reflected without transmitted light. Further, if it is too thick, no further heat dissipation effect will be obtained but the productivity will be poor, and cracks are likely to form, and accordingly it is usually at most 500 nm.

The preferred layer structure of the optical recording medium is such a structure that a first protective layer, a recording layer, a second protective layer and a reflective layer are formed in this order along the direction of incidence of retrieving light. Namely, in a case where retrieving light is incident from the substrate side, preferred is a layer structure of a substrate, a lower protective layer, a recording layer, an upper protective layer and a reflective layer, and in a case where retrieving light is incident from the recording layer side, preferred is a layer structure of a substrate, a reflective layer, a lower protective layer, a recording layer and an upper protective layer.

Needless to say, each layer may consist of at least two layers, and an interlayer may be formed therebetween. For example, between the substrate and the protective layer in the case where the retrieving light is incident from the substrate side, or on the protective layer in the case where retrieving light is incident from the side opposite to the substrate side, an extremely thin translucent layer of a metal, a semiconductor or a dielectric material having absorption property or the like may be formed so as to control the amount of light energy incident on the recording layer.

Each of the recording layer, the protective layer and the reflective layer if formed usually by e.g. a sputtering method.

The film formation is carried out preferably by placing a target for recording layer, a target for protective layer or a target for reflective layer material as the case requires, in an in-line device located in the same vacuum chamber because the oxidation and contamination by adjacent layers can be prevented. Further, such a method is advantageous in productivity.

On the outermost side of the optical recording medium, a protective coat comprising an ultraviolet-curing resin or a thermosetting resin is preferably formed so as to prevent a direct contact with air or to prevent scars due to contact with a foreign substance. The protective coat usually has a thickness of from 1 μm to several hundreds μm. Further, a dielectric material protective layer having a high hardness may further be formed, or a resin layer may further be formed thereon.

(B) Method of Initial Crystallization of the Optical Recording Medium

The recording layer is formed usually by a physical deposition method in vacuum such as a sputtering method, and the recording layer is usually amorphous in a state immediately after film formation (in an as-deposited state), and accordingly this is crystallized to be in a non-recorded/erased state in the present invention. This operation is called initialization. As the initial crystallization operation, oven annealing in a solid phase at a temperature of at least the crystallization temperature (usually from 150 to 300° C.) and at most the melting point, annealing by irradiation with light energy such as laser light or flash lamp light, or melt initialization may, for example, be mentioned. In the present invention, it is preferred to employ the melt initialization among the above initial crystallization operations, as a phase-change recording material with small formation of crystalline nuclei is employed.

In the melt initialization, if the recrystallization speed is too slow, another crystalline phase may form as there is a sufficient time to achieve thermal equilibrium, and accordingly it is preferred to increase the cooling rate to a certain extent. Further, when it is kept in a melted state for a long time, the recording layer may flow, a thin film such as the protective layer may be peeled off by stress, or e.g. a resin substrate may deform, thus causing destruction of the medium.

For example, the time for which the recording layer is kept at a temperature of at least the melting point is usually at most 10 µs, preferably at most 1 µs.

Further, for the melt initialization, it is preferred to employ laser light, and it is particularly preferred to carry out the initial crystallization by using elliptical shape laser light having a minor axis substantially in parallel with the scanning direction (hereinafter this initialization method will sometimes be referred to as "bulk erasing"). In such a case, the length of the major axis is usually from 10 to 1,000 µm, and the length of the minor axis is usually from 0.1 to 5 µm.

The lengths of the major axis and the minor axis of the beam are defined from the full width at half maximum when the light energy intensity distribution of the beam is measured. The beam shape also preferably has a minor axis length of at most 5 µm, more preferably at most 2 µm, so that the local heating in a minor axis direction and rapid cooling are easily realized.

As a laser light source, various ones such as a semiconductor laser or a gas laser may be used. The laser light power is usually from about 100 mW to 10 W. Another light source may be used so long as the power density and the beam shape at the same level are obtained. Specifically, a Xe lamp light may, for example, be mentioned.

At the time of initialization by bulk erasing, when a disc recording medium is used for example, initialization of the entire surface can be carried out in such a manner that the minor axis direction of the elliptical beam is substantially agreed with the tangential direction of the disc, and scanning is carried out in the minor axis direction while rotating the disc, and at the same time, the beam is moved to the long axis (radius) direction every one cycle (one rotation). By doing this, a polycrystalline structure aligned in a specific direction relative to the focused light beam for recording/retrieving for scanning along the track in a periphery direction can be realized.

It is preferred that the distance of movement in a radius direction per one rotation is shorter than the beam major axis for overlapping, and the same radius is irradiated with laser light beam several times. As a result, secure initialization is possible, and at the same time, the non-uniformity in the initialized state derived from the energy distribution (usually from 10 to 20%) in a beam radius direction can be avoided. On the other hand, if the amount of movement is too small, the above unfavorable crystalline phase is likely to form, and accordingly the amount of movement in a radius direction is usually at least half the beam major axis.

At least whether an optical recording medium to be used in the present invention can be obtained by the melt initialization, can be judged by whether the reflectivity R1 in a non-recorded state after the initialization and the reflectivity R2 in an erased state by recrystallization after overwriting is carried out on the amorphous marks by a practical focused light beam for recording with a diameter of about 1 µm, are substantially the same. R2 is the reflectivity at the erased part after 10 times overwriting.

Accordingly, the optical recording medium to be used in the present invention preferably satisfies the following relational expression (3) where R1 is the reflectivity at a non-recorded part after the initial crystallization and R2 is the reflectivity at an erased part after 10 time overwriting:

$$\Delta R = 2|R1-R2|/(R1+R2) \times 100(\%) \leq 10 \quad (3)$$

The reason why the reflectivity R2 at an erased part after 10 time overwriting is employed as a judgment index is that when overwriting is carried out for 10 times, the influence of the reflectivity in a crystalline state which may remain in a non-recorded state by only one recording can be eliminated, and the entire surface of the optical recording medium can be in a recrystallized state at least once by recording/erasing. On the other hand, if the number of overwriting considerably exceeds 10 times, factors other than the change in the crystalline structure, such as microscopic deformation by repetitive overwriting or diffusion of another element from the protective layer, may cause the change in the reflectivity, and the judgment whether a desired crystalline state can be obtained or not tends to be difficult.

In the above relational expression (3), $\Delta R$ is at most 10%, preferably at most 5%. When it is at most 5%, an optical recording medium which causes a lower signal noise can be obtained.

For example, of the optical recording medium having an R1 at a level of 17%, R2 should be approximately within a range of from 16 to 18%. The scanning velocity of the energy beam for initialization is usually within a range of from about 3 to about 20 m/s.

The above erased state may be obtained also by melting the recording layer by irradiating a write power in a direct current mode and re-solidifying it, not necessarily by modulating the focused laser light for recording in accordance with the practical method of generating the recording pulse.

In order to obtain a desired initial crystalline state of the phase-change recording material to be used in the present invention, setting of the scanning velocity of the energy beam for initialization relative to the recording layer plane is particularly important. Basically, it is important that the crystalline state after the initial crystallization is similar to the crystalline state at the erased state after overwriting, and accordingly it is preferred that the scanning velocity of the energy beam for initialization is close to the relative scanning linear velocity of the focused light beam relative to the recording layer plane when overwriting is practically carried out by using the focused light beam. Specifically, scanning is carried out by the energy beam for initialization at a linear velocity of from about 20 to about 80% of the maximum linear velocity where recording by overwriting is possible on the optical recording medium.

The maximum linear velocity for overwriting is that the erasing ratio is at least 20 dB when, for example, an erasing power Pe is irradiated in a direct current mode at the maximum linear velocity.

The erasing ratio is defined as the difference between the carrier level of the signals for the amorphous marks recorded at the substantially same frequency and the carrier level after erasing by direct current irradiation of Pe. Measurement of the erasing ratio is carried out as follows for example. First, under the recording conditions where adequate signal properties (i.e. such properties that the reflectivity and the signal amplitude, and jitter and the like satisfy predetermined values) are obtained, a condition with a high frequency is selected among modulating signals to be recorded, and overwriting is carried out 10 times at the single frequency to form amorphous marks, and the carrier level (C.L. at recording) is measured. Then, direct current irradiation is carried out on the amorphous marks once while changing the erasing power Pe, and the carrier level at that time (C.L. after erasing) is measured, and the difference between C.L. at recording and C.L. after erasing, i.e. the erasing ratio is calculated. When the power Pe of the direct current irradiation is changed, the erasing ratio tends to once increase, decrease and increase again in general. Here, the first peak value of the erasing ratio as observed when the power Pe is started to increase, is taken as the erasing power of the sample.

If the scanning velocity of the energy beam for initialization is lower than the velocity of approximately 20% of the above-defined maximum linear velocity, phase separation may take place, whereby no single phase is likely to be obtained, or even if a single phase is obtained, the crystallites tend to extend particularly in the scanning direction of the beam for initialization and to grow to an enormous size, or tend to align in an unfavorable direction. Preferably, scanning of the energy beam for initialization is carried out at a velocity of at least 30% of the maximum linear velocity with which overwriting is possible.

On the other hand, if scanning of the energy beam for initialization is carried out at a velocity equal to the maximum linear velocity with which recording by overwriting is possible, or at a velocity higher than approximately 80% of the maximum linear velocity, the region once melted by the scanning for initialization is formed into amorphous again, such being unfavorable. This is because the cooling rate of the melted portion becomes high when the scanning linear velocity is high, and the time required for re-solidification becomes short. Recrystallization by the crystal growth from the crystal region around the periphery of the melted region will be completed in a short time with focused light beam for recording having a diameter of about 1 µm. However, when scanning is carried out with elliptical light beam for initialization, the area of the melted region in a major axis direction becomes large, and accordingly it is required to decrease the scanning linear velocity as compared with practical overwriting, so that the recrystallization at the time of re-solidification is carried out in the entire melted region. From such a viewpoint, the scanning linear velocity of the energy beam for initialization is preferably at most 70% of the maximum linear velocity for overwriting, more preferably at most 60%.

The optical recording medium to be used in the present invention has such a characteristic that when it is subjected to initial crystallization by irradiation with laser light, the rate of movement of the medium relative to the laser light can be increased. This leads to possibility of the initial crystallization in a short time, which improves productivity and makes cost cutting possible.

(C) Method of Recording/Retrieving of the Optical Recording Medium

The recording and retrieving light to be used for the optical recording medium used in the present invention is usually laser light of e.g. a semiconductor laser or a gas laser, and its wavelength is usually from 300 to 800 nm, preferably from about 350 to about 800 nm. Particularly, in order to achieve a high surface recording density of at least 1 Gbit/inch$^2$, the focused light beam diameter is required to be small, and it is preferred to obtain a focused light beam by using blue to red laser light having a wavelength of from 350 to 680 nm and an objective lens having a numerical aperture NA of at least 0.5.

In the present invention, as mentioned above, the amorphous state is utilized as the recording marks. Further, in the present invention, it is effective to record information by a mark length modulation method. This is particularly remarkable for mark length recording with a shortest mark length of at most 4 µm, particularly at most 1 µm.

When recording marks are formed, recording by means of a conventional two power level modulation method may be carried out, however, in the present invention, it is particularly preferred to employ a recording method by a multiple power level modulation method of at least three values wherein an off-pulse period is provided when the recording marks are formed as shown below.

Figure 2:
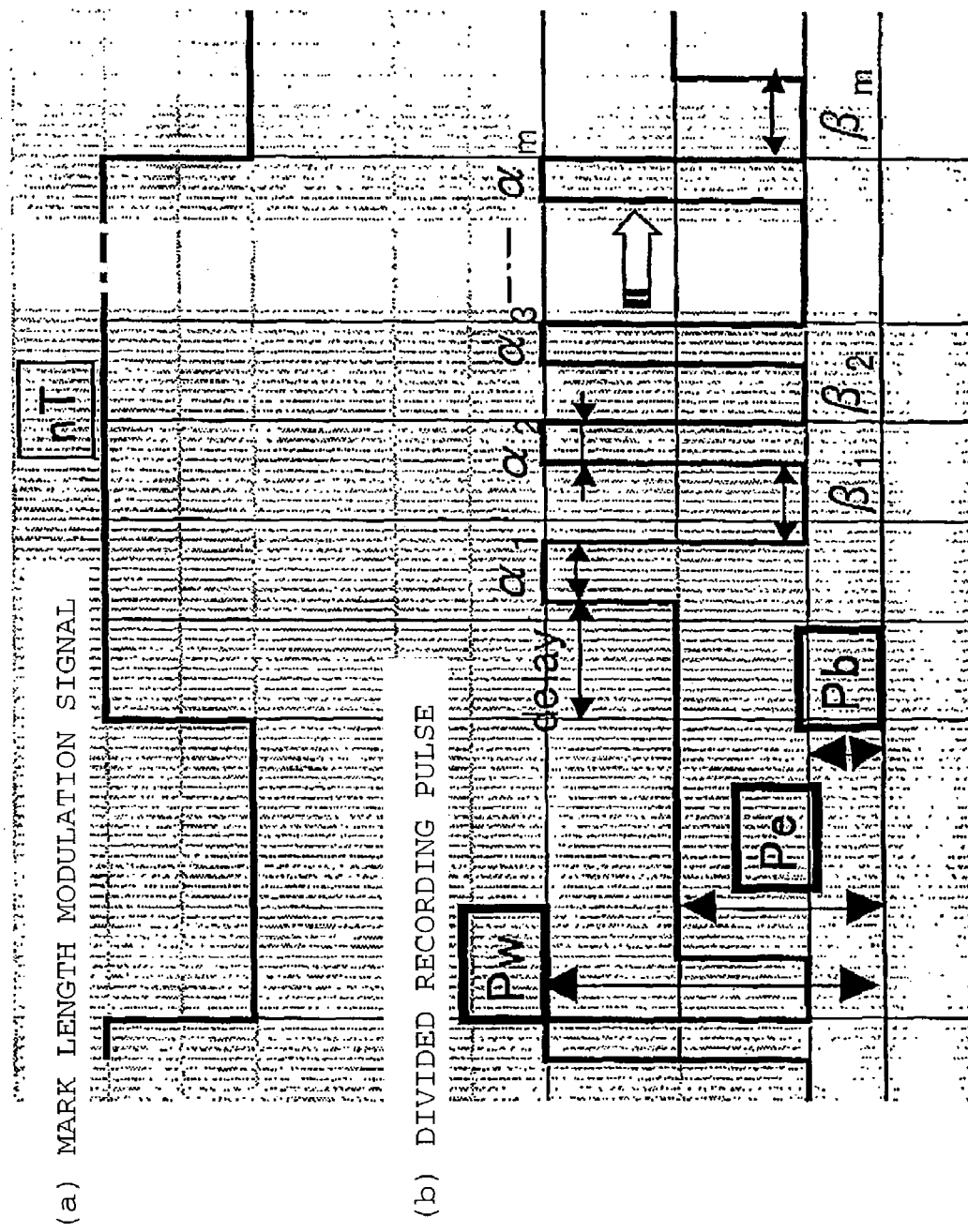
FIG. 2 is a schematic view illustrating the power pattern of recording light in a method of recording on an optical recording medium.

FIG. 2 is a schematic view illustrating a power pattern of a recording light in a method of recording on the optical recording medium. In forming amorphous mark, the mark length of which is modulated to a length nT (T is a reference clock period, n is a mark length which the mark may have by mark length modulation recording and is an integer), (n−j)T (wherein j is a real number of at least 0 and at most 2) is divided into recording pulses in a number of m=n−k (wherein k is an integer of at least 0), and the recording pulse width of each pulse is $\alpha_i T$ ($1 \leq i \leq m$), and each recording pulse is accompanied by an off-pulse section for a time of $\beta_i T$ ($1 \leq i \leq m$). In FIG. 2 which indicates a divided recording pulse, indication of the reference clock period T is omitted in view of viewability of the figure. Namely, in FIG. 2, the portion which should be described as $\alpha_i T$ is simply described as $\alpha_i$. Here, it is preferred that $\alpha_i \leq \beta_i$ or $\alpha_i \leq \beta_{i-1}$ ($2 \leq i \leq m$ or m−1). $\Sigma\alpha_i + \Sigma\beta_i$ is usually n, but it is possible that $\Sigma\alpha_i + \Sigma\beta_i = n-j$ (j is a constant which satisfies $-2 \leq j \leq 2$) in order to obtain accurate nT marks.

At the time of recording, a recording light with an erasing power Pe which may recrystallize the amorphous state is irradiated between marks. Further, recording light with a write power Pw which is sufficient to melt the recording layer is irradiated in a time of $\alpha_i T$ (i=1 to m) and a recording light with a bias power Pb of Pb<Pe, preferably Pb≦(½)Pe is irradiated in a time of $\beta_i T$ ($1 \leq i \leq m-1$).

The power Pb of the recording light to be irradiated in a time of a period $\beta_m T$ is usually Pb<Pe, preferably Pb≦½Pe in the same manner as the period of $\beta_i T$ ($1 \leq i \leq M-1$), however, it is possible that Pb≦Pe.

By employing the above recording method, the power margin or the linear velocity margin at the time of recording can be increased. This effect is particularly remarkable when the bias power Pb is adequately low so that Pb≦½Pe.

The above recording method is a method particularly suitable for an optical recording medium employing the phase-change recording material of the present invention for the recording layer. When the Ge amount is decreased to secure erasing in a short time, the critical cooling rate required for forming of amorphous marks will be extremely high, and formation of favorable amorphous marks tends to be difficult.

Namely, this is because decrease of the Ge amount accelerates recrystallization from the crystallized part around the periphery of the amorphous marks, and at the same time, increases the crystal growth rate at the time of melting and re-solidification also. If the recrystallization rate from around the periphery of the amorphous marks is increased to a certain extent, recrystallization from around the periphery of the melted region tends to proceed at the time of re-solidification of the melted region formed for recording of amorphous marks, and the melted region tends to be recrystallized without being formed into an amorphous state, unless the cooling rate is extremely high.

In addition, the clock period is shortened, and the off-pulse section becomes short, whereby the cooling effect tends to be impaired. Accordingly, it is effective to set the cooling section by off-pulses to at least 1 nsec, more preferably at lest 3 nsec as the real time by dividing the recording pulses at the time of nT mark recording.

(D) Use of the Information Recording Medium of the Present Invention Other than as an Optical Recording Medium On the information recording medium of the present invention, at least recording by a reversible phase change by irradiation with light is possible, and accordingly it can be used as an optical recording medium as described above. However, a rewritable information recording medium used in the present invention can be applied to recording by a phase change by applying an electric current to a microscopic region, for example. This point will be explained below.

FIG. 3 is a conceptual diagram illustrating the temperature history at the time of amorphous mark recording (curve a) and the temperature history at the time of erasing by recrystallization (curve b). At the time of recording, the temperature of the recording layer is increased to at least the melting point Tm in a short time by heating with a high voltage and short pulse electric current or a high power level light beam, and after the application of the electric current pulse or irradiation with light beam is terminated, the recording layer is rapidly cooled and becomes amorphous by heat dissipation to the periphery. When the cooling rate in a time $\tau_0$ when the temperature is decreased from the melting point Tm to the crystallization temperature Tg is higher than the critical cooling rate for forming an amorphous state, the recording layer becomes amorphous. On the other hand, at the time of erasing, by application of a relatively low voltage or irradiation with light energy at a low power level, the recording layer is heated to a temperature of at least the crystallization temperature Tg and approximately at most the melting point Tm, and is kept for at least a certain time, whereby recrystallization of the amorphous marks proceeds in a substantially solid state. Namely, if the holding time $\tau_1$ is sufficient, crystallization is completed.

The recording layer becomes amorphous when the temperature history as illustrated by the curve a is applied to the recording layer and the recording layer is crystallized when the temperature history as illustrated by the curve b is applied to the recording layer, even if the recording layer before application of energy for recording or erasing is in any state.

The reason why the rewritable information recording medium to be used in the present invention can be used not only as an optical recording medium but also for recording by a phase change by applying an electric current to a microscopic region, is as follows. Namely, it is the temperature history as illustrated in FIG. 3 that causes a reversible phase change, and the energy source which causes such a temperature history may be either focused light beam or heating by electric current (Joule heating by current conducting).

The change in the resistivity due to the phase change of the phase-change recording material to be used in the present invention between the crystalline state and the amorphous state is adequately comparable to the change in the resistivity of at least two digits as observed in a GeTe—$Sb_2Te_3$ pseudo-binary alloy which is being developed as a non-volatile memory at present, particularly a $Ge_2Sb_2Te_5$ stoichiometric composition alloy (J. Appl. Phys., Vol. 87 (2000), pp. 4130–4133). In fact, of a rewritable information recording medium employing the phase-change recording material having the SbSnGeTeM1 composition of the above formula (1) as the main component, the resistivity in an as-deposited amorphous state and the resistivity after crystallization by annealing were respectively measured, whereupon changes of at least three digits were confirmed (see the following Examples). Although it is considered that the amorphous state and the crystalline state obtained by amorphization and crystallization by electric current pulses are slightly different from the above as-deposited amorphous state and the crystalline state by annealing, respectively, it is expected that a significant change in the resistivity at a level of two digits will adequately be obtained even in a case of a phase change by electric current pulses of the phase-change recording material to be used in the present invention.

FIG. 4 is a sectional view illustrating the structure of one cell of such a non-volatile memory (such a non-volatile memory is also disclosed in Collected Papers of Phase-Change Optical Information Storage Symposium, 2001, pp. 61–66). In FIG. 4, the electric voltage is applied to between an upper electrode 1 and a lower electrode 2, and electricity is applied to the phase-change recording layer 3 containing a phase-change recording material (hereinafter sometimes referred to simply as a phase-change recording layer 3) and a heater portion 4. The phase-change recording layer 3 is covered with an insulating material 10 of e.g. $SiO_2$. Further, the phase-change recording layer 3 is crystallized in an initial state. The initial crystallization in such a case is carried out by heating the entire system of FIG. 4 to a crystallization temperature of the recording layer (usually from about 100 to about 300° C.). For formation of an integrated circuit, the rise in temperature to such an extent is commonly carried out.

Further, on the portion 4 (heater portion) which is particularly thin in FIG. 4, heat generation due to Joule heating is likely to occur by conducting between the upper electrode 1 and the lower electrode 2, and accordingly it functions as a localized heater. A reversibly changeable portion 5 adjacent thereto is locally heated and becomes amorphous via the temperature history as illustrated by the curve a in FIG. 3, and recrystallized via the temperature history as illustrated in the curve b in FIG. 3.

Read-out is carried out in such a manner that a low electric current to such an extent that heat generation at the heater portion 4 is ignorable is applied, and a potential difference generated between the upper and lower electrodes is read. There is also a difference in the electric capacity between the crystalline and amorphous states, and thus the difference in the electric capacity may also be detected.

In fact, a more integrated memory by using the semiconductor integrated circuit formation technology has been proposed (U.S. Pat. No. 6,314,014). Its basic structure is as illustrated in FIG. 4, and by incorporating the phase-change recording material to be used in the present invention into the phase-change recording layer 3, the same functions can be realized.

As an energy source which causes a temperature change as illustrated in FIG. 3, electron beam may also be mentioned. As an example of a recording device employing electron beam, a method of generating a phase change on a phase-change recording material by locally irradiating electron beam emitted by a field emitter, as disclosed in U.S. Pat. No. 5,557,596, may be mentioned.

Now, Examples wherein the phase-change recording material of the present invention is applied to an optical recording medium (the optical recording medium will sometimes be referred to simply as a disc in Examples) and Examples wherein the applicability of the phase-change recording material of the present invention to a rewritable information recording medium on which recording is carried out by a change in the electric resistance, will be explained. The following Examples are merely one embodiment of the present invention, and the present invention is by no means restricted to an optical recording medium and application to a rewritable information recording medium on which recording is carried out by a change in the electric resistance, unless they exceed the gist of the invention.

in a substantially single phase, and the crystal grain sizes were approximately at most about several µm.

For measurement of the composition of the phase-change recording material used for a recording layer of an optical recording medium, acid dissolution ICP-AES (Inductively Coupled Plasma-Atomic Emission Spectrometry) was employed. By using JY 38 S manufactured by JOBIN YVON as an analyzer, the recording layer was dissolved in diluted $HNO_3$ (diluted nitric acid) and quantitative analysis was carried out by means of matrix matching calibration method.

Measurement of the disc properties was carried out by using DDU1000 manufactured by Pulstec Industrial Co., Ltd., by applying focus servo and tracking servo to grooves with a retrieving power of less than 1 mW.

EXAMPLES 1 AND 2 AND COMPARATIVE EXAMPLES 1 TO 4

On a disc-shape polycarbonate substrate with a diameter of 120 mm and a thickness of 1.2 mm, having guide grooves with a groove width of approximately 0.5 µm, a groove depth of approximately 40 nm and a groove pitch of 1.6 µm, a $(ZnS)_{80}(SiO_2)_{20}$ layer (80 nm), a Ge—Sb—Sn recording layer (15 nm), a $(ZnS)_{80}(SiO_2)_{20}$ layer (30 nm) and a $Al_{99.5}Ta_{0.5}$ alloy reflective layer (200 nm) were formed by a sputtering method to prepare a phase-change optical disc.

The values x and y when the recording layer composition is represented as $(Sb_{1-x}Sn_x)_{1-y}Ge_y$ are shown in Table 1.

TABLE 1

| | Composition: $(Sb_{1-x}Sn_x)_{1-y}Ge_y$ | | Initial | Recording | |
| --- | --- | --- | --- | --- | --- |
| | x | y | crystallization | properties | Remarks |
| Ex. 1 | 0.25 | 0.18 | Good | Good | |
| Ex. 2 | 0.32 | 0.18 | Good | Good | |
| Comp. Ex. 1 | 0 | 0.11 | Poor | Poor | Uniform initial crystallization |
| | 0 | 0.16 | | | infeasible |
| | 0 | 0.21 | | | |
| Comp. Ex. 2 | 0.25 | 0.09 | Good | Poor | Amorphous mark formation infeasible |
| Comp. Ex. 3 | 0.25 | 0.35 | Poor | Poor | Slow crystallization speed |
| Comp. Ex. 4 | 0.59 | 0.16 | Good | Poor | Difficult to satisfy both |
| | 0.59 | 0.19 | Good | Poor | amorphous mark formation |
| | 0.59 | 0.21 | Good | Poor | and mark crystallization |
| | 0.59 | 0.23 | Good | Poor | |
| | Composition: $(Sb_{1-x}Sn_x)_{1-y}In_y$ | | Initial | Recording | |
| | x | y | crystallization | Property | Remarks |
| Comp. Ex. 5 | 0.26 | 0.18 | Good | Poor | Amorphous mark formation |
| | 0.31 | 0.28 | Good | Poor | infeasible |
| | 0.31 | 0.34 | Good | Poor | |

In Examples of the optical recording medium, the reflectivity at a portion on which amorphous recording marks are formed, is relatively low as compared with the reflectivity in the crystalline state after the initial crystallization (in a non-recorded state) and after erasing. Further, the recording mark portions being in an amorphous state and the erased/non-recorded state being in a polycrystalline state in the recording layer of the optical recording medium were confirmed by observation of the recording layer by a transmission electron microscope. Further, the crystalline state was Each of these discs was subjected to initial crystallization as follows. Namely, a laser light having a wavelength of 810 nm and a power of 1,600 mW and having a shape with a width of about 1 µm and a length of about 150 µm was irradiated on the disc rotating at 12 m/s so that the major axis was perpendicular to the above guide grooves, and the laser light was continuously moved in a radius direction with a feed of 60 µm per rotation to carry out initialization.

Then, EFM random signals were recorded at a linear velocity of 28.8 m/s by using a disc evaluation apparatus (DDU1000) having a laser wavelength of 780 nm and a pickup of NA0.5 as follows. Marks with lengths of from 3T to 11T (T is a reference clock period and is 9.6 nsec) contained in the EFM signals were formed by irradiating a series of pulses of the following laser pulses connected in sequence.

3T: Pulse with a power Pw and a length 2T, pulse with a power Pb and a length 0.6T.

4T: Pulse with a power Pw and a length 1T, pulse with a power Pb and a length 0.95T, pulse with a power Pw and a length 1.05T, pulse with a power Pb and a length 0.3T.

5T: Pulse with a power Pw and a length 1T, pulse with a power Pb and a length 1.35T, pulse with a power Pw and a length 1.45T, pulse with a power Pb and a length 0.3T.

6T: Pulse with a power Pw and a length 1T, pulse with a power Pb and a length 1T, pulse with a power Pw and a length 1T, pulse with a power Pb and a length 0.9T, pulse with a power Pw and a length 1T, pulse with a power Pb and a length 0.3T.

7T: Pulse with a power Pw and a length 1T, pulse with a power Pb and a length 1.35T, pulse with a power Pw and a length 1T, pulse with a power Pb and a length 1T, pulse with a power Pw and a length 1.4T, pulse with a power Pb and a length 0.3T.

8T: Pulse with a power Pw and a length 1T, pulse with a power Pb and a length 1T, pulse with a power Pw and a length 1T, pulse with a power Pb and a length 1T, pulse with a power Pw and a length 1T, pulse with a power Pb and a length 0.9T, pulse with a power Pw and a length 1T, pulse with a power Pb and a length 0.3T.

9T: Pulse with a power Pw and a length 1T, pulse with a power Pb and a length 1.35T, pulse with a power Pw and a length 1T, pulse with a power Pb and a length 1T, pulse with a power Pw and a length 1T, pulse with a power Pb and a length 1T, pulse with a power Pw and a length 1.4T, pulse with a power Pb and a length 0.3T.

10T: Pulse with a power Pw and a length iT, pulse with a power Pb and a length 1T, pulse with a power Pw and a length 1T, pulse with a power Pb and a length 1T, pulse with a power Pw and a length 1T, pulse with a power Pb and a length 1T, pulse with a power Pw and a length 1T, pulse with a power Pb and a length 0.9T, pulse with a power Pw and a length 1T, pulse with a power Pb and a length 0.3T.

11T: Pulse with a power Pw and a length 1T, pulse with a power Pb and a length 1.35T, pulse with a power Pw and a length 1T, pulse with a power Pb and a length 1T, pulse with a power Pw and a length 1T, pulse with a power Pb and a length 1T, pulse with a power Pw and a length 1T, pulse with a power Pb and a length 1T, pulse with a power Pw and a length 1.4T, pulse with a power Pb and a length 0.3T.

When each of the above laser pulses of 3T to 11T is represented by the notation system as shown in FIG. 2, $\alpha_i$ and $\beta_i$ are as shown in Table 2. In the section $\alpha_i T$, a write power Pw is irradiated, and in the section $\beta_i T$, a bias power Pb=0.8 mW is irradiated.

TABLE 2

| | $\alpha_i, \beta_i$ | | | | | | | | |
|---|---|---|---|---|---|---|---|---|---|
| $\alpha_1$ | $\beta_1$ | $\alpha_2$ | $\beta_2$ | $\alpha_3$ | $\beta_3$ | $\alpha_4$ | $\beta_4$ | $\alpha_5$ | $\beta_5$ |
| 3T | 2.0 | 0.6 | | | | | | | |
| 4T | 1.0 | 0.95 | 1.05 | 0.3 | | | | | |
| 5T | 1.0 | 1.35 | 1.45 | 0.3 | | | | | |
| 6T | 1.0 | 1.0 | 1.0 | 0.9 | 1.0 | 0.3 | | | |
| 7T | 1.0 | 1.35 | 1.0 | 1.0 | 1.4 | 0.3 | | | |
| 8T | 1.0 | 1.0 | 1.0 | 1.0 | 1.0 | 0.9 | 1.0 | 0.3 | |
| 9T | 1.0 | 1.35 | 1.0 | 1.0 | 1.0 | 1.0 | 1.4 | 0.3 | |
| 10T | 1.0 | 1.0 | 1.0 | 1.0 | 1.0 | 1.0 | 1.0 | 0.9 | 1.0 | 0.3 |
| 11T | 1.0 | 1.35 | 1.0 | 1.0 | 1.0 | 1.0 | 1.0 | 1.0 | 1.4 | 0.3 |

An erasing power Pe was irradiated between pulses for mark formation. Further, the irradiation position of the pulses for 3T mark formation was shifted toward ahead of the original position of the 3T mark in the EFM random signal by 0.35T (the irradiation was carried out at earlier timing than the original 3T mark in the EFM signal), and the irradiation position of the pulses for 4T mark formation was shifted toward ahead of the original timing of the 4T mark in the EFM random signal by 0.1T. By doing this, the marks to be formed are closer to the original random signals. Further, during recording, the Pe/Pw ratio was fixed to 0.31 unless otherwise specified.

The recorded part was retrieved at a linear velocity of 1.2 m/s to evaluate the properties of the recording signals.

The results of evaluation of the discs of Examples 1 and 2 are shown in FIGS. 5 and 6, respectively. Items evaluated are 3T mark jitter and 3T space jitter of retrieving signals when EFM random signals were recorded by overwriting ten times while changing Pw in a range of from 22 to 28 mW (the results are shown in FIG. 5(a) and FIG. 6(a)), the reflectivity at a crystalline part (the results are shown in FIG. 5(b) and FIG. 6(b)), the signal amplitude defined by "(signal level reflectivity of crystallized part)-(signal level reflectivity of 11T mark part)" (the results are shown in FIG. 5(c) and FIG. 6(c)), and 3T mark jitter and 3T space jitter of retrieving signals when repetitive direct overwriting was carried out by fixing the write power (the results are shown in FIG. 5(d) and FIG. 6(d)). The write power at the time of repetitive direct overwriting was 25 mW in Example 1 and 24 mW in Example 2.

Figure 5A:
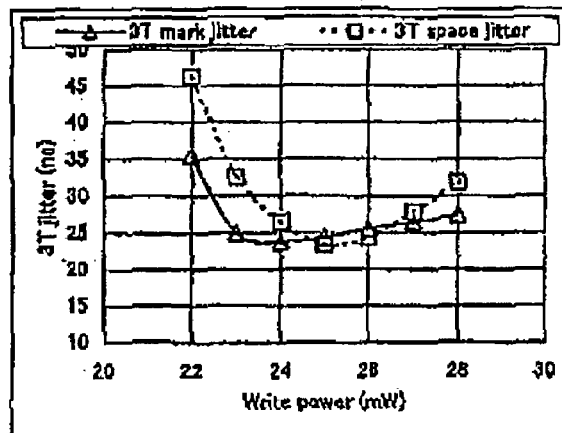
Figure 5B:
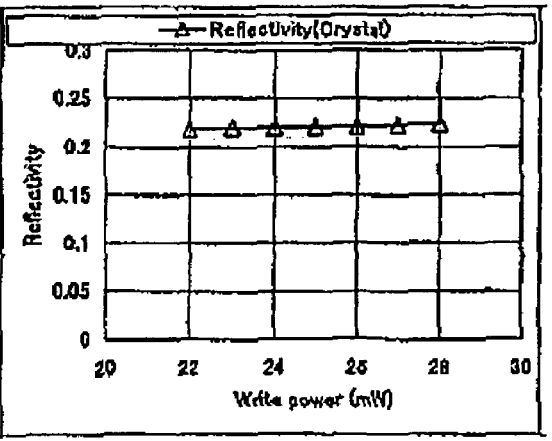
Figure 5C:
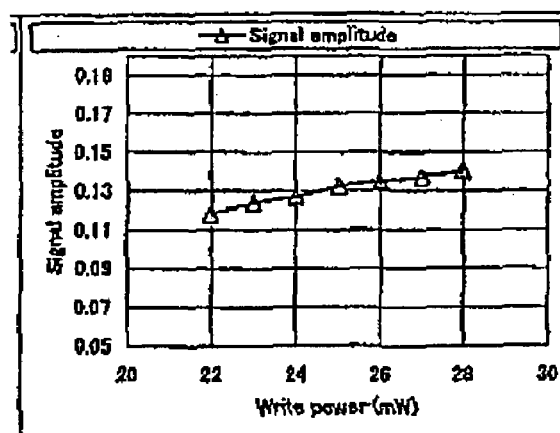
Figure 5D:
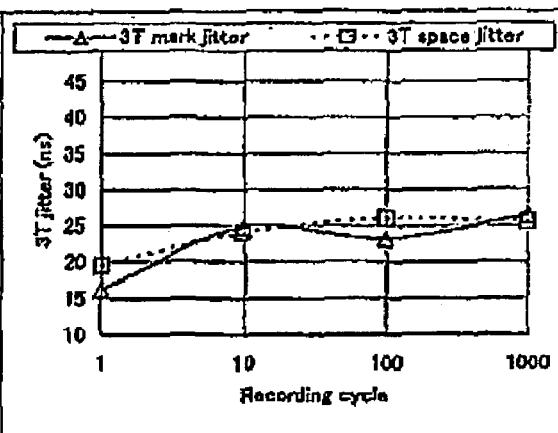

It is found from the results shown in FIGS. 5(d) and 6(d) that there is a recording condition under which the jitter value is adequately smaller than 40 nsec by 1,000 times or less overwriting for each of the discs of Examples 1 and 2. Accordingly, it is found that each of the discs of Examples 1 and 2 is adequately practicable as a rewritable information recording medium from this viewpoint. In the vicinity of the recording layer composition of each of the discs of Examples 1 and 2, when the recording layer composition is represented as $(Sb_{1-x}Sn_x)_{1-y}Ge_y$, the repetitive overwriting properties tend to be excellent when the value x is smaller, as shown by comparison of FIGS. 6(d) and FIG. 5(d). Further, as shown from the comparison between FIG. 5(c) and FIG. 6(c), the signal amplitude tends to be excellent when the value x is higher.

Further, when a Sb—Sn—Ge—M1 composition was employed as the phase-change recording material, and Bi, Ta, W, Nb, N, O, C, Se, Al, Si, Zn or V was added in an amount of from about 1 to about 10 atomic % as the element M1 $((Sb_{1-x}Sn_x)_{1-y-z}Ge_yM1_z$ wherein x=0.25, y=0.18 and $0.01 \leq z \leq 0.1$ or x=0.32, y=0.18 and $0.01 \leq z \leq 0.1$) in each of the discs of Examples 1 and 2, the same rewritable recording properties as those of the discs of Examples 1 and 2 were obtained.

Further, when each of these discs was kept at 105° C. for 3 hours and then the above recorded part was retrieved, whereupon no deterioration of the jitter of the recorded signals or signal amplitude was shown at all.

As shown in Table 1, with respect to each of the discs of Comparative Example 1, no uniform increase in the reflectivity by the initial crystallization operation was shown, and there were always several parts on which the reflectivity was locally low in a track corresponding to one rotation of the disc. Further, as shown in Table 1, no uniform initial crystallization could be carried out on each of the discs of Comparative Example 1 even by changing the crystallization speed by controlling the Ge amount.

Further, of each of the discs of Comparative Example 1, the noise level was higher than that of the disc of Example 1 by 13 dB when the noise level was measured at 500 kHz by means of a spectrum analyzer (manufactured by ADVANTEST CORPORATION, TR4171) at a linear velocity of 1.2 m/s with a resolution band width of 30 kHz with a video band width of 30 Hz.

With respect to each of the discs of Comparative Example 1, initial crystallization was attempted also by irradiating DC laser light of from 6 to 12 W at a linear velocity of from 1.2 to 4.8 m/s by using a disc evaluation apparatus, however, no uniform increase in the reflectivity was shown, and the initial crystallization could not be favorably carried out. Recording of amorphous marks was attempted on each of the above discs on which no uniform initial crystallization could be carried out, the jitter was at least 40 nsec at the first recording. This means that the crystalline state and the amorphous state can not be utilized as a non-recorded state and a recorded state, respectively, in each of the discs of Comparative Example 1.

From these results, it is found that when the phase-change recording material contains no Sn, use as an information recording medium utilizing the crystalline state as a non-recorded state and the amorphous state as a recorded state tends to be difficult.

Further, of the disc of Comparative Example 3 also, no uniform increase in the reflectivity by the initialization operation was shown. This is considered to be because the phase change speed from the amorphous phase to the crystalline phase is too slow as the Ge content is high ($y=0.35$). With respect to the disc of Comparative Example 3, initial crystallization was attempted also by irradiating DC laser light of from 6 to 12 mW at a linear velocity of from 1.2 to 4.8 m/s (at this linear velocity range, the disc is very close to a stationary state) by using a disc evaluation apparatus, however, no uniform increase in the reflectivity was shown, and the initial crystallization could not favorably be carried out. From these results, it is found that when the Ge content of the phase-change recording material is higher than 0.3, use as a rewritable information recording medium tends to be difficult.

With respect to the disc of Comparative Example 2, although uniform reflectivity was obtained after the initial crystallization, no formation of amorphous marks could be performed. Further, formation of amorphous marks was attempted by changing the linear velocity, formation of amorphous marks could not be carried out at least at a linear velocity of at most 38.4 m/s. This is considered to be because the crystallization speed was too high as the Ge content was low ($y=0.09$), and accordingly the melted portion was recrystallized. From these results, it was found that when the Ge content of the phase-change recording material is lower than 0.1, use as a rewritable information recording medium is substantially difficult. A linear velocity of at least 38.4 m/s could not be achieved due to restriction in view of apparatus in general, and thus amorphous mark formation is substantially impossible. Even if amorphization is achieved under an extremely special condition, such an amorphous mark should be easily recrystallized soon at room temperature. And thus, it is not suitable for storage media.

With respect to each of the discs of Comparative Example 4, although uniform reflectivity was obtained after the initial crystallization, no 3T space jitter of at most 40 nsec could be obtained when recording/retrieving was carried out under the same conditions as in Examples 1 and 2. Further, discs of Comparative Example 4 by changing the Ge content thereby to change the crystallization speed were prepared as shown in Table 1, and the recording properties of these discs were examined. As a result, it was found that with respect to each disc of Comparative Example 4 wherein x is fixed to 0.59, it is difficult to satisfy both formation of amorphous marks and crystallization of amorphous marks even by changing the Ge content, and further, the signal amplitude is at a level of 0.05 and is small at least with a composition which provide a crystallization speed required for crystallization of the marks. Namely, if the Sn content is too high, use as a rewritable medium is substantially difficult.

COMPARATIVE EXAMPLE 5

Each of the discs of Comparative Example 5 is a disc of Example 1 except that a phase-change recording material wherein Ge is replaced with In was used. Of each of the discs of Comparative Example 5, the values of x and y when the recording layer composition is represented as $(Sb_{1-x}Sn_x)_{1-y}In_y$, whether initial crystallization was possible or not and recording properties are shown in Table 1.

In the phase-change recording material used for each of the discs of Comparative Example 5, the Sn amount was within a range of from 0.01 to 0.5 and the In amount is within a range in the vicinity of from 0.1 to 0.3 (within the range of Ge content in the present invention). With respect to each of these discs, although uniform reflectivity was obtained after the initial crystallization, formation of amorphous marks could not be performed at least at a linear velocity of at most 38.4 m/s. Formation of amorphous marks could not be performed even by changing the In content.

From these results, it is found that Ge is important for formation of amorphous marks, and use as an information recording medium is substantially difficult when Ge is replaced with In. With a composition $(Sb_{0.73}Sn_{0.27})0.56In_{0.44}$ wherein the In amount was further increased, the recording material was changed to a state which was considered to be another crystalline state with a low reflectivity, at the time of initial crystallization.

Accordingly, a favorable optical recording medium can be obtained with a composition $(Sb_{1-x}Sn_x)_{1-y}Ge_y$ wherein $0.01 \leq x \leq 0.5$ and $0.1 \leq y \leq 0.3$.

EXAMPLE 3

The following experiment was carried out so as to examine whether the phase-change recording material of the present invention can be used as a recording material for an information recording medium on which recording is carried out by the change in the electric resistance.

Namely, on a polycarbonate substrate with a diameter of 120 mm, a $Ge_{0.18}Sb_{0.66}Sn_{0.16}$ (($Sb_{1-x}Sn_x)_{1-y}Ge_y$, wherein x=0.2 and y=0.18) amorphous film in a film thickness of 50 nm was formed by sputtering. After the resistivity of this amorphous film was measured, the film was crystallized and the resistivity of the film after recrystallization was measured again. The crystallization was chaired out under the same conditions as for the discs of Examples, and for measurement of the resistivity, a resistivity meter Loresta MP (MCP-T350) manufactured by DIA INSTRUMENTS was used. The resistivities before and after the crystallization were $1.03\times10^{-1}$ Ωcm and $0.80\times10^{-4}$ Ωcm, respectively, and it was found that there is a change in the resistivity by almost three orders of magnitude as between the amorphous state and the crystalline state.

In the same method as mentioned above, on a polycarbonate substrate, a $Ge_{0.17}Sb_{0.75}Sn_{0.08}$ (($Sb_{1-x}Sn_x)_{1-y}Ge_y$, wherein x=0.1 and y=0.17) amorphous film was formed by sputtering, and the resistivities of the film in an amorphous state and in a crystalline state were measured. As a result, the resistivity in an amorphous state was $5.96\times10^{-1}$ Ωcm and the resistivity in a crystalline state was $0.8\times10^{-4}$ Ωcm, and it was found that there is a change in the resistivity of almost three orders of magnitude as between the amorphous state and the crystalline state.

Further, in the same method as mentioned above, on a polycarbonate substrate, a $Ge_{0.16}Sb_{0.84}$ (($Sb_{1-x}Sn_x)_{1-y}Ge_y$, wherein x=0 and y=0.16) amorphous film was formed by sputtering, and the resistivities of the film in an amorphous state and in a crystalline state were measured. As a result, the resistivity in an amorphous state was $1.51\times10^{-0}$ Ωcm and the resistivity in a crystalline state was $0.7\times10^{-4}$ Ωcm, and it was found that there is a change in the resistivity of almost four orders of magnitude as between the amorphous state and the crystalline state.

From the results of measurement of the resistivities of the films formed from the three phase-change recording materials, it is found that the change in the resistivity as between the amorphous state and the crystalline state can be controlled by changing the Sn content in the phase-change recording material. Namely, it is found that the change in the resistivity as between the amorphous state and the crystalline state becomes significant when the Sn content is decreased.

In a case where the phase-change recording material of the present invention is used for a non-volatile memory utilizing the change in the resistivity, a composition containing no Sn ($0 \leq x$ in the composition $(Sb_{1-x}Sn_x)_{1-y-w-z}Ge_yTe_wM1_z$) may be employed only to make the change in resistivity significant. However, usually, it is required to control the change in the resistivity to be within a predetermined range from the viewpoint of design of an electronic circuit into which the non-volatile memory is incorporated. Accordingly, by using a phase-change recording material containing Sn, a high performance non-volatile memory wherein the change in the resistivity is controlled to be within a predetermined range can be obtained.

Further, a favorable change in the resistivity as between the amorphous state and the crystalline state can be obtained also by adding an element such as Te or the element M1 to the above GeSbSn ternary composition. In fact, on a polycarbonate substrate, a $Ge_{0.08}In_{0.11}Sb_{0.65}Sn_{0.11}Te_{0.05}$ (($Sb_{1-x}Sn_x)_{1-y-w-z}Ge_yTe_wIn_z$ wherein x=0.14, y=0.08, w=0.05 and z=0.11) amorphous film was formed by sputtering, and the resistivities of the film in an amorphous state and in a crystalline state were measured. As a result, the resistivity in an amorphous state was $8.73\times10^1$ Ωcm and the resistivity in a crystalline state was $1.12\times10^{-4}$ Ωcm, and it was found that there is a change in the resistivity of almost three orders of magnitude as between the amorphous state and the crystalline state.

From the above experiment, it is found that the phase-change recording material to be used in the present invention can be applied to a rewritable information recording medium on which recording is carried out by the change in the electric resistance, since the difference in the resistivity due to a phase change as between the amorphous state and the crystalline state can be controlled to be within a predetermined range while the difference is made to be significant.

EXAMPLES 4 to 11 and COMPARATIVE EXAMPLE 6

For measurement of the composition of a phase-change recording material used for a recording layer of an optical recording medium, acid dissolution ICP-AES (Inductively Coupled Plasma-Atomic Emission Spectrometry) and a X-ray fluorescent analyzer were employed. Regarding the acid dissolution ICP-AES, using JY 38 S manufactured by JOBIN YVON as an analyzer, the recording layer was dissolved in diluted $HNO_3$ and quantitative evaluation was carried out by means of a matrix matching calibration method. As the X-ray fluorescent analyzer, RIX3001 manufactured by Rigaku Denki Kogyo K.K. was used.

Measurement of the disc properties was carried out by using DDU1000 manufactured by PULSTEC INDUSTRIAL Co., Ltd., by applying focus servo and tracking servo to grooves with a retrieving power of 0.8 mW.

On a disc-shape polycarbonate substrate with a diameter of 120 mm and a thickness of 1.2 mm, having guide grooves with a groove width of approximately 0.5 μm, a groove depth of approximately 40 nm and a groove pitch of 1.6 μm, a $(ZnS)_{80}(SiO_2)_{20}$ layer, a Ge—Sb—Sn—M1 recording layer, a $(ZnS)_{80}(SiO_2)_{20}$ layer and a $Al_{99.5}Ta_{0.5}$ alloy reflective layer were formed by a sputtering method, whereby 8 types of phase-change optical discs were prepared (Comparative Example 6 and Examples 4 to 10). Similarly, a phase-change optical disc comprising a $(ZnS)_{80}(SiO_2)_{20}$ layer, a Ge—Sb—Sn—M recording layer, a $(ZnS)_{80}(SiO_2)_{20}$ layer, a germanium nitride layer and a Ag reflective layer was also prepared (Example 11). The germanium nitride layer is an interfacial layer to prevent mutual diffusion of elements between the $(ZnS)_{80}(SiO_2)_{20}$ layer and the Ag layer.

Of each disc, the film thickness and the values x, y and z when the recording layer composition is represented as $(Sb_{1-x}Sn_x)_{1-y-z}Ge_yM1_z$ are shown in Table 3. As evident from Table 3, film thicknesses of layers constituting the discs are slightly different. This is to make the reflectivity at the crystallized part and the signal amplitude be at the same level. The reflectivities at the crystallized part of all the discs except for Comparative Example 6 were within a range of from 19 to 21%.

TABLE 3

| | | Film thickness | | | | | | Composition | | | Noise | 3T space jitter/write power | | | |
|---|---|---|---|---|---|---|---|---|---|---|---|---|---|---|---|
| | Element M1 | ZnS—SiO$_2$ | Recording layer | ZnS—SiO$_2$ | AlTa | GeN | Ag | x | y | z | (dBm) | Recording before aging | After aging | Recording after aging | Remarks |
| Ex. 4 | — | 80 | 18 | 30 | 200 | — | — | 0.2 | 0.18 | 0 | −49.6 | 39.1 ns/ 26 mW | — | — | |
| Ex. 5 | In | 80 | 18 | 30 | 200 | — | — | 0.13 | 0.16 | 0.04 | −59.8 | — | — | — | |
| Ex. 6 | Pd | 80 | 16 | 30 | 200 | — | — | 0.19 | 0.15 | 0.01 | −58.9 | — | — | — | |
| Ex. 7 | Pt | 80 | 18 | 30 | 200 | — | — | 0.2 | 0.17 | 0.01 | −59.6 | — | — | — | |
| Ex. 8 | Ag | 80 | 16 | 30 | 200 | — | — | 0.2 | 0.14 | 0.02 | −58 | — | — | — | |
| Ex. 9 | — | 80 | 15 | 30 | 200 | — | — | 0.24 | 0.18 | 0 | — | 25.6 ns/ 26 mW | 24.5 ns | 48.8 ns/29 mW | |
| Ex. 5 | In | 80 | 18 | 30 | 200 | — | — | 0.13 | 0.16 | 0.04 | — | 22.0 ns/ 26 mW | 21.0 ns | 39.2 ns/28 mW | |
| Ex. 10 | In | 80 | 18 | 30 | 200 | — | — | 0.08 | 0.15 | 0.08 | — | 27.5 ns/ 26 mW | 26.3 ns | 40.7 ns/29 mW | |
| Ex. 11 | In | 95 | 18 | 27 | — | 3 | 200 | 0.08 | 0.15 | 0.08 | — | 26.4 ns/ 28 mW | 25.1 ns | 28.3 ns/31 mW | |
| Comp. Ex. 6 | In | 80 | 18 | 30 | 200 | — | — | 0.08 | 0.04 | 0.36 | — | — | — | — | Small change of reflectivity |

Each of these discs was subjected to the initial crystallization as follows. Namely, laser light having a wavelength of 810 nm and a power of 1,600 mW and having a shape with a width of about 1 μm and a length of about 150 μm was irradiated on the disc rotating at 12 m/s so that the major axis was perpendicular to the above guide grooves, and the laser light was continuously moved in a radius direction with a feed of 60 μm per one rotation to carry out initialization. As this initialization conditions were not optimum depending upon the disc, DC laser light of 10 mW was irradiated once at a linear velocity of 4 m/s by using a disc evaluation apparatus having a laser wavelength of 780 nm and a pickup of NA0.5.

The disc of Comparative Example 6 could not function as a recording medium as the change in the reflectivity by the above initialization operation was small.

With respect to each of the discs of Example 4 and Examples 5 to 8, the noise at the initialized part was measured under the following conditions. Namely, the noise level at 500 kHz was measured by using a spectrum analyzer (TR4171 manufactured by ADVANTEST CORPORATION) at a linear velocity of 1.2 m/s with a evaluation band width of 30 kHz with a video band width of 30 Hz. The results are shown in Table 3. The noise of each of the discs of Examples 5 to 8 is small as compared with the disc of Example 4. With the GeSbSn type material, the noise tends to be significant when the Sn content (the value x) is low. Accordingly, the noise of the disc of Example 4 wherein x=0.2 is slightly strong, however, in Examples 5 to 8 wherein the value of x is equal to or less than that of Example 4, the noise is apparently small, and it is found that the effect of reducing noise by addition of In, Pd, Pt or Ag is high.

Then, EFM random signals were recorded on each of the discs of Examples 4, 5, 9, 10 and 11 (In added or not added system) at a linear velocity of 28.8 m/s by using a disc evaluation apparatus (DDU1000) having a layer wavelength of 780 nm and a pickup of NA0.5 as described hereinafter. Marks with lengths of from 3T to 11T (T is a reference clock period and is 9.6 nsec) contained in the EFM signals were formed by irradiating a series of pulses of the following laser pulses connected in sequence.

3T: Pulse with a power Pw and a length 2T, pulse with a power 0.8 mW and a length 0.6T.

4T: Pulse with a power Pw and a length 1T, pulse with a power 0.8 mW and a length 0.95T, pulse with a power Pw and a length 1.05T, pulse with a power 0.8 mW and a length 0.3T.

5T: Pulse with a power Pw and a length 1T, pulse with a power 0.8 mW and a length 1.35T, pulse with a power Pw and a length 1.45T, pulse with a power 0.8 mW and a length 0.3T.

6T: Pulse with a power Pw and a length 1T, pulse with a power 0.8 mW and a length 1T, pulse with a power Pw and a length 1T, pulse with a power 0.8 mW and a length 0.9T, pulse with a power Pw and a length 1T, pulse with a power 0.8 mW and a length 0.3T.

7T: Pulse with a power Pw and a length 1T, pulse with a power 0.8 mW and a length 1.35T, pulse with a power Pw and a length 1T, pulse with a power 0.8 mW and a length 1T, pulse with a power Pw and a length 1.4T, pulse with a power 0.8 mW and a length 0.3T.

8T: Pulse with a power Pw and a length 1T, pulse with a power 0.8 mW and a length 1T, pulse with a power Pw and a length 1T, pulse with a power 0.8 mW and a length 1T, pulse with a power Pw and a length 1T, pulse with a power 0.8 mW and a length 0.9T, pulse with a power Pw and a length 1T, pulse with a power 0.8 mW and a length 0.3T.

9T: Pulse with a power Pw and a length 1T, pulse with a power 0.8 mW and a length 1.35T, pulse with a power Pw and a length 1T, pulse with a power 0.8 mW and a length 1T, pulse with a power Pw and a length 1T, pulse with a power 0.8 mW and a length 1T, pulse with a power Pw and a length 1.4T, pulse with a power 0.8 mW and a length 0.3T.

10T: Pulse with a power Pw and a length 1T, pulse with a power 0.8 mW and a length 1T, pulse with a power Pw and a length 1T, pulse with a power 0.8 mW and a length 1T, pulse with a power Pw and a length 1T, pulse with a power 1T, pulse with a power 0.8 mW and a length 0.9T, pulse with a power Pw and a length 1T, pulse with a power 0.8 mW and a length 0.3T.

11T: Pulse with a power Pw and a length 1T, pulse with a power 0.8 mW and a length 1.35T, pulse with a power Pw and a length 1T, pulse with a power 0.8 mW and a length 1T, pulse with a power Pw and a length 1T, pulse with a power 0.8 mW and a length 1T, pulse with a power Pw and a length 1T, pulse with a power 0.8 mW and a length 1T, pulse with a power Pw and a length 1T, pulse with a power 0.8 mW and a length 1T, pulse with a power Pw and a length 1.4T, pulse with a power 0.8 mW and a length 0.3T.

An erasing power Pe was irradiated between the above pulses for mark formation. Further, the irradiation position of the pulses for 3T mark formation was shifted toward ahead of the original position of the 3T mark in the EFM random signals by 0.35T (the irradiation was carried out at earlier timing than the original 3T mark in the EFM signal), and the irradiation position of the pulses for 4T mark formation was shifted toward ahead of the original timing of the 4T mark in the EFM random signals by 0.1T. By doing this, marks to be formed are closer to the original EFM random signals. Further, the Pe/Pw ratio was fixed at 0.31 during recording.

On each of the discs, the above EFM random signals were recorded by overwriting ten times by using such a write power that the jitter with a length between marks corresponding to a length 3T (hereinafter referred to as 3T space jitter") becomes almost minimum after recording by overwriting ten times with changing the write power Pw (hereinafter sometimes referred to as "recording before aging"), and the 3T space jitter was measured. The value of 3T space jitter and the value of the write power are shown in Table 3. In Table 3, the values of the 3T space jitter and the write power are shown in the column "recording before aging".

Then, each of the discs of Examples 5, 9, 10 and 11 was held in an environment of 105° C. for 3 hours (aging test). Then, the recorded part was retrieved (hereinafter sometimes be referred to as "after aging"), and the 3T space jitter was measured. The values of the 3T space jitter is shown in Table 3. In Table 3, the value of the 3T space jitter is shown in the column "after aging".

Further, EFM random signals were recorded once on the recorded part before aging while changing the write power after the aging test (hereinafter sometimes be referred to as "recording after aging"), and the 3T space jitter was measured. The value of the smallest 3T space jitter and the write power are shown in Table 3. In Table 3, the values of the 3T space jitter and the write power are shown in the column "recording after aging".

This aging test was carried out under very severe conditions as compared with a conventional environmental test. Thus, if the properties after this aging test deteriorate, it can be said that the performances of the disc in practical use are adequately secured.

Retrieving of the recording marks was carried out at a linear velocity of 1.2 m/s.

Although the noise of the disc of Example 4 is somewhat significant, the 3T space jitter by recording before aging was at most 40 nsec, and the disc was adequately practicable.

The jitter properties (the value of 3T space jitter) of the disc of Example 9 by recording before aging are better than those of the disc of Example 4 since the Sn content is high (the value x is high). However, the value of 3T space jitter by recording after aging is 48.8 nsec and is slightly high. On the other hand, with respect to each of the discs of Example 5, 10 and 11 wherein In was added to a composition with a small Sn (a small x), it is found that the value of 3T space jitter by recording after aging is improved.

As shown from the comparison between Example 10 and Example 11 using substantially same recording layer compositions, the recording properties after aging become better by employing Ag as the reflective layer.

Further, no deterioration of the jitter at the recorded part before aging due to the aging test was shown on any disc, and it is found that the amorphous marks are adequately stable.

EXAMPLE 12 AND COMPARATIVE EXAMPLE 7

Disks were prepared in the same manner as mentioned above (Examples 4 to 11 and Comparative Example 6) except that Te was used as the element to be added, and the Te content was 5 atomic % (Example 12) or 11 atomic % (Comparative Example 7), and each of the discs was evaluated. Of each of the discs, the film thickness and the values of x, y and w when the recording layer composition is represented as $(Sb_{1-x} Sn_x)_{1-y-w}Ge_yTe_w$ are shown in Table 4.

TABLE 4

| | | Film thickness(nm) | | | | | | | | | | | 3T space jitter/write power | | | |
|---|---|---|---|---|---|---|---|---|---|---|---|---|---|---|---|---|
| | Element M1 | ZnS—SiO$_2$ | Recording layer | ZnS—SiO$_2$ | AlTa | GeN | Ag | \multicolumn{4}{c}{Composition} | | | | Noise (dBm) | Recording before aging | After aging | Recording after aging | Remarks |
| | | | | | | | | x | y | z | w | | | | | |
| Ex. 12 | — | 80 | 15 | 30 | 200 | — | — | 0.22 | 0.14 | 0 | 0.05 | — | 25.7 ns/ 26 mW | 24.1 ns | 39.8 ns/ 28 mW | |
| Comp. Ex. 7 | — | 80 | 15 | 30 | 200 | — | — | 0.22 | 0.11 | 0 | 0.11 | — | — | — | — | Reflectivity: 12% |

With respect to the disc of Example 12, the recording properties after aging at the same level as the above Examples 5 and 10 were obtained, and it is found that the recording properties after aging are favorable by addition of Te. The reflectivity at the crystallized part of the disc of Example 12 was 16.6% and showed a value slightly lower than those of discs of other Examples.

The disc of Comparative Example 7 was not a practicable phase-change optical disc as the reflectivity in a crystalline state was so low as 12.1% and the signal amplitude was low.

Further, no deterioration of the jitter at the recorded part before aging due to the aging test was shown on the disc of Example 12 also, and it is found that the amorphous marks are adequately stable.

EXAMPLES 13 TO 17

For measurement of the composition of a phase-change recording material used for a recording layer of an optical recording medium, acid dissolution ICP-AES (Inductively Coupled Plasma-Atomic Emission Spectrometry) and a X-ray fluorescent analyzer were employed. Regarding the acid dissolution ICP-AES, using JY 38 S manufactured by JOBIN YVON as an analyzer, the recording layer was dissolved in diluted $HNO_3$ and quantitative evaluation was carried out by means of a matrix matching calibration method. As the X-ray fluorescent analyzer, RIX3001 manufactured by Rigaku Denki Kogyo K.K. was used.

Measurement of the disc properties was carried out by using DDU1000 manufactured by PULSTEC INDUSTRIAL Co., Ltd., by applying focus servo and tracking servo to grooves with a retrieving power of 0.8 mW.

On a disc-shape polycarbonate substrate with a diameter of 120 mm and a thickness of 1.2 mm, having guide grooves with a groove width of approximately 0.5 µm, a groove depth of approximately 40 nm and a groove pitch of 1.6 µm, a $(ZnS)_{80}(SiO_2)_{20}$ layer, a Ge—Sb—Sn—M1 recording layer, a $(ZnS)_{80}(SiO_2)_{20}$ layer and a $Al_{99.5}Ta_{0.5}$ alloy reflective layer were formed by a sputtering method, whereby two types of phase-change optical discs wherein M1 was Tb and Gd, respectively (Examples 13 and 14) were prepared. Namely, Tb was used as the element M1 in Example 13, and Gd was used as the element M1 in Example 14.

Then, the same phase-change optical disc of Example 4 except that the reflective layer was a Ag reflective layer, and a germanium nitride layer was inserted between the reflective layer and the protective layer was prepared (Example 15). Similarly, the same phase-change optical discs of Examples 13 and 14 except that the reflective layer was a Ag reflective layer, and a germanium nitride layer was inserted between the reflective layer and the protective layer, were prepared (Examples 16 and 17). The reason why the germanium nitride layer was inserted between the reflective layer and the protective layer in the case of using the Ag reflective layer is to prevent mutual diffusion of elements between the $(ZnS)_{80}(SiO_2)_{20}$ protective layer and the Ag reflective layer.

The element M1, the layer structure, the film thickness and the values of x, y and z when the recording layer composition is represented as $(Sb_{1-x}Sn_x)_{1-y-z}Ge_yM1_z$, of each of the discs of Examples 4, 13 and 14 are shown in Table 5.

Each of the discs was subjected to initial crystallization as follows. Namely, laser light having a wavelength of 810 nm and a power of 1,600 mW and having a shape with a width of about 1 µm and a length of about 150 µm was irradiated on the disc rotating at 12 m/s so that the major axis was perpendicular to the above guide grooves, and the laser light was continuously moved in a radius direction with a feed of 60 µm per one rotation. Then, DC laser light of 10 mW was irradiated once at a linear velocity of 4 m/s by using a disc evaluation apparatus having a laser wavelength of 780 nm and a pickup of NA0.5.

The reflectivity at the crystallized part of each of the discs of Examples 13 and 14 after initial crystallization was within a range of from 19 to 21%. Further, the reflectivity at the crystallized part of the disc of Example 4 after initial crystallization was also within a range of from 19 to 21% (see Example 4).

Each of the discs of Examples 13 and 14 was subjected to noise measurement in the same manner as the discs of Example 4 and Examples 5 to 8. The results are shown in Table 5. The noise of each of the discs of Examples 13 and 14 was small as compared with the disc of Example 4, and it is found that the effect of reducing the noise is high by addition of a lanthanoid such as Tb or Gd i.e. a rare earth element.

Then, repetitive overwriting durability of each of the discs of Examples 15 to 17 was measured by using a disc evaluation apparatus having a laser wavelength of 780 nm and a pickup of NA0.5. EFM random signals were recorded at a linear velocity of 28.8 m/s as mentioned hereinafter. Marks with lengths of from 3T to 11T (T is a reference clock period and is 9.6 nsec) contained in EFM signals were formed by irradiating a series of pulses of the following laser pulses connected in sequence.

3T: Pulse with a power Pw and a length 2T, pulse with a power 0.8 mW and a length 0.6T.

4T: Pulse with a power Pw and a length 1.1T, pulse with a power 0.8 mW and a length 0.95T, pulse with a power Pw and a length 1.15T, pulse with a power 0.8 mW and a length 0.3T.

5T: Pulse with a power Pw and a length 1.1T, pulse with a power 0.8 mW and a length 1.4T, pulse with a power Pw and a length 1.55T, pulse with a power 0.8 mW and a length 0.3T.

6T: Pulse with a power Pw and a length 1.1T, pulse with a power 0.8 mW and a length 1T, pulse with a power Pw and a length 1T, pulse with a power 0.8 mW and a length 0.9T, pulse with a power Pw and a length 1.1T, pulse with a power 0.8 mW and a length 0.3T.

7T: Pulse with a power Pw and a length 1.1T, pulse with a power 0.8 mW and a length 1.4T, Pulse with a power Pw

TABLE 5

| | Element | Film thickness (nm) | | | | | | Composition | | | Noise |
|---|---|---|---|---|---|---|---|---|---|---|---|
| | | | Recording | | | | | | | | |
| | M1 | ZnS—SiO₂ | layer | ZnS—SiO₂ | AlTa | GeN | Ag | x | y | z | (dBm) |
| Ex. 4 | — | 80 | 18 | 30 | 200 | — | — | 0.2 | 0.18 | 0 | −49.6 |
| Ex. 13 | Tb | 80 | 18 | 30 | 200 | — | — | 0.2 | 0.14 | 0.03 | −59.7 |
| Ex. 14 | Gd | 80 | 18 | 30 | 200 | — | — | 0.2 | 0.14 | 0.04 | −58.8 |
| Ex. 15 | — | 90 | 16 | 17 | — | 3 | 150 | 0.31 | 0.17 | 0 | — |
| Ex. 16 | Tb | 90 | 16 | 17 | — | 3 | 150 | 0.31 | 0.15 | 0.03 | — |
| Ex. 17 | Gd | 90 | 16 | 17 | — | 3 | 150 | 0.31 | 0.15 | 0.04 | — | and a length 1T, pulse with a power 0.8 mW and a length 1T, pulse with a power Pw and a length 1.5T, pulse with a power 0.8 mW and a length 0.3T.

8T: Pulse with a power Pw and a length 1.1T, pulse with a power 0.8 mW and a length 1T, pulse with a power Pw and a length 1T, pulse with a power 0.8 mW and a length 1T, Pulse with a power Pw and a length 1T, pulse with a power 0.8 mW and a length 0.9T, pulse with a power Pw and a length 1.1T, pulse with a power 0.8 mW and a length 0.3T.

9T: Pulse with a power Pw and a length 1.1T, pulse with a power 0.8 mW and a length 1.4T, pulse with a power Pw and a length 1T, pulse with a power 0.8 mW and a length 1T, Pulse with a power Pw and a length 1T, pulse with a power 0.8 mW and a length 1T, pulse with a power Pw and a length 1.5T, pulse with a power 0.8 mW and a length 0.3T.

10T: Pulse with a power Pw and a length 1.1T, pulse with a power 0.8 mW and a length 1T, pulse with a power Pw and a length 1T, pulse with a power 0.8 mW and a length 1T, pulse with a power Pw and a length 1T, pulse with a power 0.8 mW and a length 1T, pulse with a power Pw and a length 1T, pulse with a power 0.8 mW and a length 0.9T, pulse with a power Pw and a length 1.1T, pulse with a power 0.8 mW and a length 0.3T.

11T: Pulse with a power Pw and a length 1.1T, pulse with a power 0.8 mW and a length 1.4T, pulse with a power Pw and a length 1T, pulse with a power 0.8 mW and a length 1T, pulse with a power Pw and a length 1T, pulse with a power 0.8 mW and a length 1T, pulse with a power Pw and a length 1T, pulse with a power 0.8 mW and a length 1T, pulse with a power Pw and a length 1.5T, pulse with a power 0.8 mW and a length 0.3T.

An erasing power Pe was irradiated between the above pulses for mark formation. The irradiation position of the pulses for 3T mark formation was shifted toward ahead of the original position of the 3T mark in the EFM random signal by 0.3T (the irradiation was carried out at earlier timing than the original 3T mark in the EFM signal), and the irradiation position of pulses for 4T mark formation was shifted toward ahead of the original timing of the 4T mark in the EFM random signal by 0.1T. By doing this, the marks to be formed are closer to the original EFM random signals. Further, Pe/Pw=8 mW/26 mW at the time of recording.

The relation between the number of repetitive overwriting and the 3T space jitter of each of the discs of Examples 15 to 17 is shown in FIG. 7. Retrieving was carried out at 1.2 m/s. Each of the discs of Examples 15 to 17 provides favorable jitter properties until the number of repetitive overwriting is 1,000 times, and it is found that they are discs having no problem in view of practical use. However, with respect to the disc of Example 15, as the number of repetitive overwriting was further increased, the 3T space jitter became 46.2 nsec at the time of overwriting for 2,000 times. It is considered that since no lanthanoid element i.e. rare earth element was contained in the phase-change recording material of the disc of Example 15, the crystallization speed decreased due to the repetitive overwriting, and erasing of the marks was incomplete, whereby the jitter increased. On the other hand, each of the discs of Examples 16 and 17 wherein a lanthanoid (Tb, Gd) was incorporated into the phase-change recording material showed a favorable jitter value even after overwriting for 2,000 times. This is considered to be because decrease of the crystallization speed due to increase in the number of the repetitive overwriting is reduced by addition of a lanthanoid.

REFERENCE EXAMPLE 1

The following experiment was carried out to examine whether the recording layer composition used for the disc of Example 15 is suitable for formation of crystalline marks, i.e. whether it is possible to record crystalline marks in the amorphous film after sputtering of the recording layer.

The disc used for the experiment was prepared in the same manner as in Example 15 except that the film thickness of the $(ZnS)_{80}(SiO_2)_{20}$ layer adjacent to the substrate was 150 nm. This is because the reflectivity of the amorphous film in a state where sputtering of the recording layer was carried out (non-recorded state in a case of forming crystalline marks) of the disc of Example 15 as it was, was low, and no focus servo could be applied, and thus the film thickness of the $(ZnS)_{80}(SiO_2)_{20}$ layer was made thicker than that of Example 15 to increase the reflectivity of the amorphous film and thereby to apply focus servo. As a result of making the film thickness of the $(ZnS)_{80}(SiO_2)_{20}$ layer adjacent to the substrate 150 nm, the reflectivity of the amorphous film was 7%, whereby focus servo and tracking servo could be applied.

DC laser light of from 5 to 20 mW was irradiated once at a linear velocity of 28.8 m/s by using a disc evaluation apparatus (DDU1000 manufactured by Pulstec Industrial Co., Ltd.), however, no crystallization took place at all. Taking that the erasing power Pe (the erasing power is a power to erase the amorphous marks i.e. a crystallization power) was 8 mW in Example 15 into consideration, the above DC laser light of from 5 to 20 mW provides an adequately wide range of laser power so as to confirm whether the crystalline marks can be formed or not. As no crystalline phase marks could be formed even with such a wide range of laser power, it can be said that recording of crystalline marks on the amorphous film of the disc is very difficult. Namely, it is considered that substantially no crystalline nuclei are present in the amorphous recording layer of the disc immediately after film formation, or even if they are present, they are not so dense as to form crystalline marks.

Further, when the above DC laser light was irradiated several times, crystallization took place and an increase in the reflectivity was observed. However, the increase in the reflectivity was not uniform, and it was observed that a part which was likely to be crystallized and a part which was hardly crystallized were mingled. This indicates that crystalline nuclei are not originally present in such a number that crystalline marks having a high signal quality can be formed, in the recording layer composition of Example 15. Accordingly, even by carrying out a pretreatment such as irradiation with laser on the disc, the number of the crystalline nuclei in the recording layer in an amorphous state is originally small, and thus it is difficult to form crystalline marks having recording properties which can be used practically.

Accordingly, it is found that the density of the crystalline nuclei is very low in the phase-change recording material of the present invention in an amorphous state particularly in an amorphous state immediately after film formation by sputtering. Accordingly, it is found that on an information recording medium employing this phase-change recording material, it is very difficult to apply a recording method utilizing the crystalline state as recording marks.

EXAMPLES 18 AND 19 AND COMPARATIVE EXAMPLES 8 and 9

For measurement of the composition of a phase-change recording material used for a recording layer of an optical recording medium, acid dissolution ICP-AES (Inductively Coupled Plasma-Atomic Emission Spectrometry) and a X-ray fluorescent analyzer were employed. Regarding the acid dissolution ICP-AES, using JY 38 S manufactured by JOBIN YVON as an analyzer, the recording layer was dissolved in diluted $HNO_3$ and quantitative evaluation was carried out by means of a matrix matching calibration method. As the X-ray fluorescent analyzer, RIX3001 manufactured by Rigaku Denki Kogyo K.K. was used.

Measurement of the disc properties was carried out by using DDU1000 manufactured by PULSTEC INDUSTRIAL Co., Ltd. by applying focus servo and tracking servo to grooves with a retrieving power of 0.8 mW.

On a disc-shape polycarbonate substrate with a diameter of 120 mm and a thickness of 1.2 mm, having guide grooves with a groove width of approximately 0.5 μm, a groove depth of approximately 40 nm and a groove pitch of 1.6 μm, a $(ZnS)_{80}(SiO_2)_{20}$ layer, a Ge—Sb—Sn—M1-T recording layer, a $(ZnS)_{80}(SiO_2)_{20}$ layer, a Ta layer and a Ag reflective layer were formed by a sputtering method, whereby phase-change optical discs wherein M1 was In were prepared (Examples 18 and 19 and Comparative Example 8). The reason why the Ta layer was inserted between the reflective layer and the protective layer in the case of using the Ag reflective layer is to prevent mutual diffusion of elements between the $(ZnS)_{80}(SiO_2)_{20}$ protective layer and the Ag reflective layer. In Comparative Example 9, no In was used as the element m1, and a $Ag_{99.5}Ta_{0.5}$ reflective layer was formed instead of the Ta layer and the Ag reflective layer.

The element M1, the layer structure, the film thickness and the values of x, y, z and w when the recording layer composition is represented as $(Sb_{1-x}Sn_x)_{1-y-z}Ge_yM1_zTa_w$, of each disc are shown in Table 6.

after overwriting for 10 times were measured by using a disc evaluation apparatus having a laser wavelength of 780 nm and a pickup of NA0.5.

On the disc of Example 18, recording was carried out under the following condition. EFM random signals were recorded at a linear velocity of 28.8 m/s as mentioned hereinafter. Marks with lengths of from 3T to 11T (T is a reference clock period and is 9.6 nsec) contained in EFM signals were formed by irradiating a series of pulses of the following laser pulses connected in sequence.

3T: Pulse with a power Pw and a length 1.4T, pulse with a power 0.8 mW and a length 0.85T.

4T: Pulse with a power Pw and a length 1T, pulse with a power 0.8 mW and a length 1.1T, pulse with a power Pw and a length 0.9T, pulse with a power 0.8 mW and a length 0.4T.

5T: Pulse with a power Pw and a length 1T, pulse with a power 0.8 mW and a length 1.45T, pulse with a power Pw and a length 1.4T, pulse with a power 0.8 mW and a length 0.4T.

6T: Pulse with a power Pw and a length 1T, pulse with a power 0.8 mW and a length 1.1T, pulse with a power Pw and a length 0.9T, pulse with a power 0.8 mW and a length 1.1T, pulse with a power Pw and a length 0.9T, pulse with a power 0.8 mW and a length 0.4T.

7T: Pulse with a power Pw and a length 1T, pulse with a power 0.8 mW and a length 1.1T, pulse with a power Pw and a length 0.9T, pulse with a power 0.8 mW and a length 1.45T, pulse with a power Pw and a length 1.4T, pulse with a power 0.8 mW and a length 0.4T.

8T: Pulse with a power Pw and a length 1T, pulse with a power 0.8 mW and a length 1.1T, pulse with a power Pw and a length 0.9T, pulse with a power 0.8 mW and a length 1.1T, pulse with a power Pw and a length 0.9T, pulse with a power

TABLE 6

| | | Film thickness (nm) | | | | | Composition | | | | Noise | 3T space jitter/write power | | | |
| | | | | | | | | | | | | Recording before aging | After aging | Recording after aging | |
| | Element M1 | ZnS—SiO$_2$ | Recording layer | ZnS—SiO$_2$ | AlTa | Ta | Ag | x | y | z | w | (dBm) | | | | Remarks |
|---|---|---|---|---|---|---|---|---|---|---|---|---|---|---|---|---|
| Ex. 18 | In | 88 | 15.5 | 24 | — | 4 | 185 | 0.15 | 0.07 | 0.11 | 0.04 | — | 23.2 ns/ 32 mW | — | — | Recording linear velocity: 28.8 m/s |
| Ex. 19 | In | 80 | 18 | 23 | — | 2 | 200 | 0.17 | 0.04 | 0.13 | 0.08 | — | 34.9 ns/ 42 mW | — | — | Recording linear velocity: 38.4 m/s |
| Comp. Ex. 8 | In | 88 | 15.5 | 24 | — | 4 | 185 | 0.16 | 0 | 0.13 | 0.04 | — | — | — | — | Amorphous recording infeasible |
| Comp. Ex. 9 | — | 80 | 15 | 30 | 200 | — | — | 0.22 | 0 | 0 | 0.05 | — | — | — | — | Amorphous recording infeasible |

Each of the discs was subjected to initial crystallization as follows. Namely, laser light having a wavelength of 810 nm and a power of 1,600 mW and having a shape with a width of about 1 μm and a length of about 150 μm was irradiated on the disc rotating at 12 m/s so that the major axis was perpendicular to the above guide grooves, and the laser light was continuously moved in a radius direction with a feed of 60 μm per one rotation.

Then, of each of the discs of Examples 18, 19 and Comparative Examples 8 and 9, recording signal properties 0.8 mW and a length 1.1T, pulse with a power Pw and a length 0.9T, pulse with a power 0.8 mW and a length 0.4T.

9T: Pulse with a power Pw and a length 1T, pulse with a power 0.8 mW and a length 1.1T, pulse with a power Pw and a length 0.9T, pulse with a power 0.8 mW and a length 1.1T, pulse with a power Pw and a length 0.9T, pulse with a power 0.8 mW and a length 1.45T, pulse with a power Pw and a length 1.4T, pulse with a power 0.8 mW and a length 0.4T.

10T: Pulse with a power Pw and a length 1T, pulse with a power 0.8 mW and a length 1.1T, pulse with a power Pw and a length 0.9T, pulse with a power 0.8 mW and a length 1.1T, pulse with a power Pw and a length 0.9T, pulse with a power 0.8 mW and a length 1.1T, pulse with a power Pw and a length 0.9T, pulse with a power 0.8 mW and a length 1.1T, pulse with a power Pw and a length 0.9T, pulse with a power 0.8 mW and a length 0.4T.

11T: Pulse with a power Pw and a length 1T, pulse with a power 0.8 mW and a length 1.1T, pulse with a power Pw and a length 0.9T, pulse with a power 0.8 mW and a length 1.1T, pulse with a power Pw and a length 0.9T, pulse with a power 0.8 mW and a length 1.1T, pulse with a power Pw and a length 0.9T, pulse with a power 0.8 mW and a length 1.45T, pulse with a power Pw and a length 1.4T, pulse with a power 0.8 mW and a length 0.4T.

An erasing power Pe was irradiated between the above pulses for mark formation. Pe/Pw=0.27 during recording.

The values of 3T space jitter and Pw after 10 times overwriting are shown in Table 6. Retrieving was carried out at 1.2 m/s. It is found from Table 6 that the disc of Example 18 has excellent overwriting jitter properties. The value y representing the Ge amount is 0.07, which is a considerably small value as compared with the value y of Example 1 for example. This indicates that the Ge amount can be decreased by incorporation of Te or In as compared with discs having the same level of crystallization speed.

Recording was carried out on the disc of Example 19 under the following conditions. EFM random signals were recorded at a linear velocity of 38.4 m/s as mentioned hereinafter. Marks with lengths of from 3T to 11T (T is a reference clock period and is 7.2 nsec) contained in the EFM signals were formed by irradiating a series of pulses of the following laser pulses connected in sequence.

3T: Pulse with a power Pw and a length 1.81T, pulse with a power 0.8 mW and a length 0.75T.

4T: Pulse with a power Pw and a length 1T, pulse with a power 0.8 mW and a length 1.06T, pulse with a power Pw and a length 0.94T, pulse with a power 0.8 mW and a length 0.31T.

5T: Pulse with a power Pw and a length 1T, pulse with a power 0.8 mW and a length 1.31T, pulse with a power Pw and a length 1.38T, pulse with a power 0.8 mW and a length 0.31T.

6T: Pulse with a power Pw and a length 1T, pulse with a power 0.8 mW and a length 1.06T, pulse with a power Pw and a length 0.94T, pulse with a power 0.8 mW and a length 1.06T, pulse with a power Pw and a length 0.94T, pulse with a power 0.8 mW and a length 0.31T.

7T: Pulse with a power Pw and a length 1T, pulse with a power 0.8 mW and a length 1.06T, pulse with a power Pw and a length 0.94T, pulse with a power 0.8 mW and a length 1.31T, pulse with a power Pw and a length 1.38T, pulse with a power 0.8 mW and a length 0.31T.

8T: Pulse with a power Pw and a length 1T, pulse with a power 0.8 mW and a length 1.06T, pulse with a power Pw and a length 0.94T, pulse with a power 0.8 mW and a length 1.06T, Pulse with a power Pw and a length 0.94T, pulse with a power 0.8 mW and a length 1.06T, pulse with a power Pw and a length 0.94T, pulse with a power 0.8 mW and a length 0.31T.

9T: Pulse with a power Pw and a length 1T, pulse with a power 0.8 mW and a length 1.06T, pulse with a power Pw and a length 0.94T, pulse with a power 0.8 mW and a length 1.06T, pulse with a power Pw and a length 0.94T, pulse with a power 0.8 mW and a length 1.31T, pulse with a power Pw and a length 1.38T, pulse with a power 0.8 mW and a length 0.31T.

10T: Pulse with a power Pw and a length 1T, pulse with a power 0.8 mW and a length 1.06T, pulse with a power Pw and a length 0.94T, pulse with a power 0.8 mW and a length 1.06T, pulse with a power Pw and a length 0.94T, pulse with a power 0.8 mW and a length 1.06T, pulse with a power Pw and a length 0.94T, pulse with a power 0.8 mW and a length 1.06T, pulse with a power Pw and a length 0.94T, pulse with a power 0.8 mW and a length 0.31T.

11T: Pulse with a power Pw and a length 1T, pulse with a power 0.8 mW and a length 1.06T, pulse with a power Pw and a length 0.94T, pulse with a power 0.8 mW and a length 1.06T, pulse with a power Pw and a length 0.94T, pulse with a power 0.8 mW and a length 1.06T, pulse with a power Pw and a length 0.94T, pulse with a power 0.8 mW and a length 1.31T, pulse with a power Pw and a length 1.38T, pulse with a power 0.8 mW and a length 0.31T.

An erasing power Pe was irradiated between the above pulses for mark formation. Further, the irradiation position of the pulses for 3T mark formation was shifted toward ahead of the original timing of the 3T mark in the EFM random signals by 0.06T (irradiation was carried out at earlier time than the original 3T mark in the EFM signal). By doing this, the marks to be formed are closer to the original EFM random signals. Pe/Pw=0.25 during recording.

The values of 3T space jitter and Pw after 10 times overwriting are shown in Table 6. Retrieving was carried out at 1.2 m/s. It is found from Table 6 that the disc of Example 19 has excellent overwriting jitter properties. The value y representing the Ge amount is 0.04. It is found that the Ge amount can be decreased by incorporation of Te or In. This indicates that the Ge amount can be decreased by incorporation of Te or In as compared with discs having the same level of crystallization speed.

On the other hand, on each of the discs of Comparative Examples 8 and 9 containing no Ge, amorphous marks could not adequately be formed at least at a linear velocity of at most 38.4 m/s. Accordingly, use as an information recording medium is substantially difficult.

According to the present invention, a phase-change recording material of which the phase change speed is high, on which a high speed recording/erasing is possible, which is excellent in storage stability, of which the signal intensity is high, of with which high speed initialization is possible, can be obtained, and an information recording medium employing it can be obtained. When the phase-change recording material of the present invention is used for a rewritable information recording medium, particularly favorable recording properties can be obtained.

Further, when a phase-change recording material of the present invention is used for an optical recording medium particularly a rewritable optical recording medium, an optical recording medium on which high speed recording/erasing is possible, with which storage stability of amorphous marks are excellent, which are excellent in jitter properties, which has a high reflectivity and signal amplitude, and which is excellent in repetitive overwriting properties and further, overwriting properties in overwriting is carried out on recording marks after long-term storage, can be obtained.

Further, by using the phase-change recording material of the present invention, an information recording medium with a high productivity can be obtained. Particularly when a phase-change recording material of the present invention is used for an optical recording medium, an optical recording medium of which initial crystallization is easy and which remarkably improves the productivity can be obtained.

The present invention has been described in detail with reference to specific embodiments, but it is obvious for the person skilled in the art that various changes and modifications were possible without departing from the intention and the scope of the present invention.

The entire disclosures of Japanese Patent Application No. 2002-059005 filed on Mar. 5, 2002, Japanese Patent Application No. 2002-202744 filed on Jul. 11, 2002 and Japanese Patent Application No. 2002-322708 filed on Nov. 6, 2002 including specifications, claims, drawings and summaries are incorporated herein by reference in their entireties.

What is claimed is:

1. An optical information recording medium utilizing a crystalline state as a non-recorded state and an amorphous state as a recorded state, which employs a phase-change recording material in an initially crystallized state and having the composition of the following formula (1) as the main component:

$$(Sb_{1-x}Sn_x)_{1-y-w-z}Ge_yTe_wM1_z \qquad \text{formula (1)}$$

wherein
each of x, y, z and w represents atomicity,
x, z and w are numbers which satisfy $0.01 \leqq x \leqq 0.5$, $0 \leqq z \leqq 0.3$ and w=0, respectively,
the the element M1 is at least one element selected from the group consisting of In, Ga, Pt, Pd, Ag, rare earth elements, Se, N, O, C, Zn, Si, Al, Bi, Ta, W, Nb and V; and
(I) when z=0, y is a number which satisfies $0.1 \leqq y \leqq 0.3$, and
(II) when $0 < z \leqq 0.3$, y is a number which satisfies $0.05 \leqq y \leqq 0.3$.

2. The optical information recording medium according to claim 1, wherein the information is rewritten by a reversible change of the phase-change recording material having the composition of the formula (1) as the main component, between the crystalline state and the amorphous state.

3. The optical information recording medium according to claim 1, wherein in the formula (1), $(1-x) \times (1-y-w-z) \leqq 0.5$ is satisfied.

4. The optical information recording medium according to claim 1, wherein in the formula (1) $0.1 \leqq y+z+w \leqq 0.4$ is satisfied.

5. The optical information recording medium according to claim 1, wherein in the formula (1), the value of x is $0.1 \leqq x \leqq 0.35$.

6. The optical information recording medium according to claim 1, wherein the optical information recording medium comprises a phase-change type recording layer containing the phase-change recording material having the composition of the above formula (1) as the main component, and at least one protective layer.

7. The optical information recording medium according to claim 1, wherein the optical information recording medium further comprises a reflective layer, and the reflective layer contains Ag as the main component.

8. The optical information recording medium according to claim 1, wherein when z=0 and w=0, y is a number which satisfies $0.1 < y \leqq 0.3$.

9. A method for recording information on the optical information recording medium according to claim 1, comprising:
changing the phase of the recording material from an initially crystalline state to an amorphous state.

10. The method according to claim 9, wherein the changing comprises exposing the recording medium to laser light.

* * * * *

UNITED STATES PATENT AND TRADEMARK OFFICE
CERTIFICATE OF CORRECTION

PATENT NO. : 7,166,415 B2 Page 1 of 1
APPLICATION NO. : 10/378990
DATED : January 23, 2007
INVENTOR(S) : Michikazu Horie et al.

It is certified that error appears in the above-identified patent and that said Letters Patent is hereby corrected as shown below:

Column 50, claim 3, line 5, "$\leq$" should read -- $\geq$ --.

Signed and Sealed this

Eleventh Day of September, 2007

JON W. DUDAS
*Director of the United States Patent and Trademark Office*